United States Patent
Minich

(10) Patent No.: US 10,958,001 B2
(45) Date of Patent: Mar. 23, 2021

(54) CONNECTORS FOR LOW COST, HIGH SPEED PRINTED CIRCUIT BOARDS

(71) Applicant: FCI USA LLC, Etters, PA (US)

(72) Inventor: Steven E. Minich, York, PA (US)

(73) Assignee: FCI USA LLC, Etters, PA (US)

(*) Notice: Subject to any disclaimer, the term of this patent is extended or adjusted under 35 U.S.C. 154(b) by 0 days.

(21) Appl. No.: 16/563,502

(22) Filed: Sep. 6, 2019

(65) Prior Publication Data

US 2020/0083625 A1 Mar. 12, 2020

Related U.S. Application Data

(60) Provisional application No. 62/728,657, filed on Sep. 7, 2018.

(51) Int. Cl.
| | |
|---|---|
| *H01R 12/72* | (2011.01) |
| *H05K 1/11* | (2006.01) |
| *H05K 1/18* | (2006.01) |
| *H05K 1/02* | (2006.01) |
| *H01R 12/73* | (2011.01) |

(52) U.S. Cl.
CPC ......... *H01R 12/724* (2013.01); *H01R 12/737* (2013.01); *H05K 1/0243* (2013.01); *H05K 1/115* (2013.01); *H05K 1/184* (2013.01); *H05K 2201/09227* (2013.01); *H05K 2201/09609* (2013.01); *H05K 2201/09636* (2013.01); *H05K 2201/10189* (2013.01)

(58) Field of Classification Search
CPC .................................................. H01R 12/724
See application file for complete search history.

(56) References Cited

U.S. PATENT DOCUMENTS

| | | | |
|---|---|---|---|
| 5,180,440 A | 1/1993 | Siegel | |
| 5,258,890 A | 11/1993 | de Veer | |
| 8,556,657 B1* | 10/2013 | Nichols | H01R 13/6587 439/607.07 |
| 9,545,004 B2 | 1/2017 | Minich et al. | |
| 2004/0216071 A1 | 10/2004 | Miller | |

(Continued)

FOREIGN PATENT DOCUMENTS

| | | |
|---|---|---|
| JP | 2002-530839 A | 9/2002 |
| JP | 2008-084830 A | 4/2008 |
| WO | WO 00/31832 A1 | 6/2000 |

OTHER PUBLICATIONS

Extended European Search Report for European Application No. 14746098.4 dated Oct. 28, 2016.
EP 14746098.4, Oct. 28, 2016, Extended European Search Report.

*Primary Examiner* — Ross N Gushi

(74) *Attorney, Agent, or Firm* — Wolf, Greenfield & Sacks, P.C.

(57) ABSTRACT

A connector with contact tails configured to provide a connector footprint enabling a low cost printed circuit board. The contact tails are positioned to leave routing channels, parallel to an edge of a printed circuit board, within the connector footprint. The routing channels may enable routing of high speed signal traces out of the connector footprint on a small number of routing layers. In a connector with 16 columns, each with 8 pairs of signal traces, two routing layers may be adequate to route traces connecting all of the signal vias in the connector footprint to components at the interior of the printed circuit board.

22 Claims, 7 Drawing Sheets

(56) References Cited

U.S. PATENT DOCUMENTS

| | | |
|---|---|---|
| 2005/0161254 A1 | 7/2005 | Clink |
| 2008/0101050 A1 | 5/2008 | Fung |
| 2009/0011620 A1 | 1/2009 | Avery et al. |
| 2010/0144203 A1 | 6/2010 | Glover et al. |
| 2011/0076860 A1 | 3/2011 | Cohen et al. |
| 2012/0270420 A1 | 10/2012 | Lapidot |
| 2013/0273781 A1 | 10/2013 | Buck et al. |
| 2014/0209371 A1 | 7/2014 | Minich et al. |

* cited by examiner

CONNECTORS FOR LOW COST, HIGH SPEED PRINTED CIRCUIT BOARDS

CROSS-REFERENCE TO RELATED APPLICATIONS

This applications claims priority to and the benefit under 35 U.S.C. § 119(e) of U.S. Provisional Patent Application Ser. No. 62/728,657, filed on Sep. 7, 2018, entitled "CONNECTORS FOR LOW COST, HIGH SPEED PRINTED CIRCUIT BOARDS, which is hereby incorporated herein by reference in its entirety.

BACKGROUND OF INVENTION

This application relates generally to electronic assemblies and more specifically to techniques for reducing cost of an electronic assembly.

Electronic devices, such as computers, servers and telecommunications switches, are often constructed as separate subassemblies that are then interconnected. A common technique to manufacture such a device is to fabricate the subassemblies using printed circuit boards. The printed circuit board provides a substrate on which electronic components are mounted. Conductive traces within the printed circuit board interconnect those electronic components. Connectors mounted to the printed circuit boards provide a mechanism to connect the components on the printed circuit board to components on other subassemblies or, where those connectors mate with one end of a cable assembly, to other electronic devices that similarly include connectors to mate with the other end of the cable assembly.

Printed circuit boards are manufactured through a lamination process. Sheets of insulative material, such as epoxy, that have conductive structures on one or both surfaces are placed into a stack which is then heated and pressed to fuse the layers of insulative material into a rigid board. Before pressing the layers into a board, the conductive structures are patterned. For some layers, called routing layers, the conductive structures are patterned as traces that carry signals from one location to another within the board. For other layers, called ground layers, the conductive structure covers most of the surface, with few if any traces. In operation, the ground layers may be connected to earth ground or any other potential that can serve as an AC ground for signals propagating on the signal traces. Often, the routing layers and ground layers alternate. This construction is useful for routing layers that carry high speed signals because having a ground layer above and below a layer of signal traces creates a transmission line structure around the traces that has a well-defined impedance and low loss, both of which are important in designing an electronic system. For many high speed signals, the traces are routed in pairs, shaped to carry a differential signal, with a ground layer above and below, which further contributes to desirable electrical performance of the printed circuit board.

After the sheets of insulative material are fused into a board, interconnections between the layers, called vias, may be formed. Vias are formed by drilling holes in the board. The holes are drilled through the structures that are to be connected. Conductive structures that are not to be connected by a via are designed to be a "keep out" distance away from the hole. Conductive material deposited inside the hole connects any of the conductive structure through which the hole is drilled. In this way, traces on different layers can be connected.

The vias also provide a way to mount components on the surface of the board. Conductive structures on the surface of the board, such as pads, may be connected to traces internal to the board by depositing those pads over a via. In some printed circuit boards, the holes forming the vias are used for mounting components. Some components, such as connectors, have press fit contact tails that, when pressed into a hole, compresses to exert a force on the walls of the hole, providing both an electrical and a mechanical mounting.

The number of layers of a printed circuit board is often dictated by the number of high speed signals that must be routed through a particular region of the printed circuit board. Generally, high speed signals are carried by traces that are routed on a single layer because passing a high speed signal through a via to connect traces on different layers distorts the signal, impacting system performance. For this reason, it is desirable for a high speed signal to pass through, at most, one via at its source and one via at its destination with no additional vias to transition between routing layers in between. For example, a high speed signal may be coupled to a subassembly through a connector. The signal may be coupled to a high speed routing layer through the contact tails of that connector and then routed through a signal trace, or for a differential signal, a pair of signal traces, to vias that connect to pads on a surface to which a semiconductor chip processing that signal is attached.

Traces routed on the same layer of a printed circuit board cannot cross over one another. Rather, they must maintain a minimum separation to ensure that signals on one trace do not interfere with signals on another trace. For traces forming a differential pair, the pairs of traces are separated from each other to reduce interference. The separation between traces that form a pair may be less than the spacing between pairs, but there must be some minimum separation between traces within a pair to avoid manufacturing defects and the ensure that the pair has a designed impedance. Further, the traces must be positioned to comply with the "keep out" distance around vias. If more signals must be routed through a region of the board than can fit without violating these separation requirements, another routing layer is used.

Locations where components with many signal connections are mounted to a board often drive the number of routing layers in the board. A connector, for example, may have multiple signal conductors with contact tails in closely spaced columns. For high speed signals, pairs of signal conductors may be used to carry differential signals, and each pair may have at least one ground connection associated with it. The corresponding "footprint" of the connector on the printed circuit board has multiple columns of vias, with pairs of signal vias interspersed with ground vias. The connector footprint often drives "layer count" of the printed circuit board because of the number of signal traces that must be routed through this region as well as the large number of vias, with associated "keep out" regions that limit the number of traces that can be routed on one layer in this region. It is desirable to have as few routing layers as possible, to reduce cost. It is not unusual, however, for a printed circuit board to have 7 or more routing layers for high speed signals to enable routing of signal traces to the vias in the connector footprint.

In designing a printed circuit board, it is often desirable for a the printed circuit board to have a small area. A large area tends to increase cost. Additionally, it is often desirable to make electronic devices as compact as possible. For this reason, connector footprints are often positioned at an edge of the printed circuit board and extend towards the interior of the board as short a distance as possible. With this configuration, the connector footprint leaves more of the interior area of the printed circuit board available for mounting necessary electronic components.

SUMMARY OF INVENTION

According to aspects of the present applications, there is a printed circuit board comprising an edge. The printed circuit board comprises a connector footprint comprising a plurality of signal vias adjacent the edge, wherein the plurality of vias are disposed in a plurality of columns extending in a first direction perpendicular to the edge from a first end adjacent the edge to a second end. Each of the plurality of columns comprises a plurality of pairs of the plurality of signal vias. Each of the plurality of columns comprises at least one portion in which the pairs of signal vias have a conductor-to-conductor spacing in the first direction of a first distance, and a gap, free of signal vias, at a location between the edge and the second end. The gap spans a distance in the first direction greater than the first distance. The gaps of the plurality of columns align to form a routing channel extending in a second direction parallel to the edge. The printed circuit board further comprises at least one pair of signal traces routed in the routing channel. The at least one pair of signal traces are connected to a pair of vias in a column of the plurality of columns.

In some embodiments, the gap is between the edge and the first end of the column.

In some embodiments, the gap is between the first end and the second end of the column.

In some embodiments, each of the plurality of columns has a first portion comprising at least one pair of signal vias and a second portion comprising at least one pair of signal vias, and the gap is between the first portion and the second portion of the column.

In some embodiments, the gap is a first gap at a first location and the at least one pair of signal traces is a at least one first pair of signal traces, each of the plurality of columns comprises a second gap at a second location between the edge and the second end, the second gap spans a distance in the first direction greater than the first distance, the second gaps of the plurality of columns align to form a second routing channel extending in a second direction parallel to the edge, the printed circuit board further comprises at least one second pair of signal traces routed in the second routing channel, and the at least one pair of signal traces is connected to a pair of vias in a column of the plurality of columns.

In some embodiments, the printed circuit board comprises a plurality of routing layers including a first routing layer and a second routing layer, each of the plurality of columns comprises 8 pairs of signal vias, the plurality of columns comprises 8 columns, and each of the pairs of signal vias in each of the plurality of columns is connected to a pair of signal traces routed on the first routing layer or the second routing layer.

In some embodiments, the connector footprint is a first connector footprint, the printed circuit board comprises a second connector footprint, a center-to-center spacing of the first connector footprint, and the second connector footprint is less than 65 mm.

In some embodiments, the printed circuit board comprises a plurality of routing layers, including a first routing layer, a second routing layer and a third routing layer, each of the plurality of columns comprises 8 pairs of signal vias, the plurality of columns comprises 16 columns, and each of the pairs of signal vias in each of the plurality of columns is connected to a pair of signal traces routed on the first routing layer or the second routing layer or the third routing layer.

In some embodiments, the second gap has a width between 1.6 and 2.4 times the width of the first gap.

In some embodiments, a single pair of signal traces is routed between vias of adjacent columns.

In some embodiments, the footprint is a first foot print, the printed circuit board comprises a plurality of like footprints, including the first footprint, disposed along the edge of the printed circuit board, and the plurality of footprints are disposed on an average pitch between 55 and 65 mm. In some embodiments, the plurality of footprints are disposed on an average pitch between 44 and 70 mm.

In some embodiments, an aggregate footprint area is less than 7000 millimeters squared ($mm^2$) for a connector comprising 64 pairs of signal conductors.

In some embodiments, an aggregate footprint area is less than 11500 millimeters squared ($mm^2$) for a connector comprising 128 pairs of signal conductors.

According to aspects of the present application, there is an electrical connector of the type having a mating face configured to mate with a mating connector and a mounting face configured to face a printed circuit board when the connector is mounted to the printed circuit board, wherein the mounting face comprises an edge configured to align with an edge of the printed circuit board. The electrical connector comprises a housing and a plurality of signal conductors held in the housing. The plurality of signal conductors comprise mating contact portions, contact tails and intermediate portions joining the contact tails to the mating contact portions, wherein the mating contact portions are disposed at the mating face of the connector. The plurality of contact tails are disposed in a plurality of columns extending in a first direction perpendicular to the edge of the mounting face from a first end adjacent the edge of the mounting face to a second end. Each of the plurality of columns comprise a plurality of pairs of the plurality of contact tails. Each of the plurality of columns comprises at least one portion in which the pairs of contact tails have a conductor-to-conductor spacing in the first direction of a first distance, and a gap, free of contact tails, at a location between the edge and the second end. The gap spans a distance in the first direction greater than the first distance, and the gap is in excess of 4 mm and the conductor-to-conductor spacing between adjacent pairs of contact tails is less than 2.0 mm.

In some embodiments, the connector comprises a plurality of ground conductors comprising mating contact portions, contact tails and intermediate portions joining the contact tails to the mating contact portions, the mating contact portions of the plurality of ground conductors are disposed at the mating face of the connector, and the contact tails of the ground conductors are disposed within the columns such that contact tails of the ground conductors and pairs of signal conductors are in a repeating pattern along the column.

In some embodiments, the contact tails are press fit contact tails.

In some embodiments, the press fits have a working range of less than or equal to 0.36 mm.

In some embodiments, the contact tails of each pair are edge coupled.

In some embodiments, the intermediate portions corresponding to each pair of contact tails are edge coupled.

In some embodiments, the gap is between the edge of the mounting face and the first end.

In some embodiments, the gap divides each column into two portions.

In some embodiments, the pairs of contact tails are arranged in rows and each row comprises 8 pairs.

In some embodiments, there is the electrical connector in combination with a printed circuit board, the circuit board comprising a routing channel aligned with the gap, wherein the gap is between the edge of the mounting face and the first end.

In some embodiments, there is an electrical connector in combination with a printed circuit board, the circuit board comprising a routing channel aligned with the gap, wherein the gap divides each column into two portions.

According to aspects of the present application, there is an electrical connector, comprising a housing comprising a mating face configured to mate with a mating connector and a mounting face configured to face a printed circuit board when the connector is mounted to the printed circuit board. The electrical connector comprises a plurality of signal conductors held in the housing, the plurality of signal conductors comprising mating contact portions, contact tails and intermediate portions joining the contact tails to the mating contact portions, wherein the mating contact portions are disposed at the mating face of the connector. The housing has a portion comprising the mating face on one side and a surface, opposite the mating face, that is perpendicular to and joined to the mounting face at an edge. The plurality of contact tails are disposed in a plurality of columns extending in a first direction perpendicular to the edge from a first end adjacent the edge to a second end. Each of the plurality of columns comprises a plurality of pairs of the plurality of contact tails. Each of the plurality of columns comprises at least one portion in which the pairs of contact tails have an conductor-to-conductor spacing in the first direction of a first distance, and a gap, free of contact tails, at a location between the edge and the second end, the gap spanning a distance in the first direction greater than the first distance.

DETAILED DESCRIPTION OF INVENTION

The inventors have recognized and appreciated connector designs that reduce the cost of electronic assemblies. The connectors have signal conductors with contact tails arranged so that high speed signal traces may be routed to the signal vias in the corresponding connector footprint on a printed circuit board using a small number of routing layers. The contact tails are arranged in columns, oriented to extend perpendicularly from an edge of a printed circuit board to which the connector is mounted. The contact tails are positioned within the columns to leave one or more gaps between the edge and an end of the column opposite the edge. The corresponding footprint similarly has gaps in the columns, which may be aligned so as to create routing channels parallel to the edge of the printed circuit board. The routing channels may accommodate one or more pairs of signal traces. As a result, traces may be routed to the signal vias using a small number of routing layers.

The contact tails of the connector, and corresponding signal vias in the connector footprint on the printed circuit board, may be positioned to leave a gap along the edge of the printed circuit board. Alternatively, the gap may be within the column, separating the column into two portions, each with multiple pairs of contact tails The inventors have recognized and appreciated that trading off additional connector depth as a result of using one or more such gaps for a reduction in layer count results in advantageous characteristics of a printed circuit board.

Figure 1:
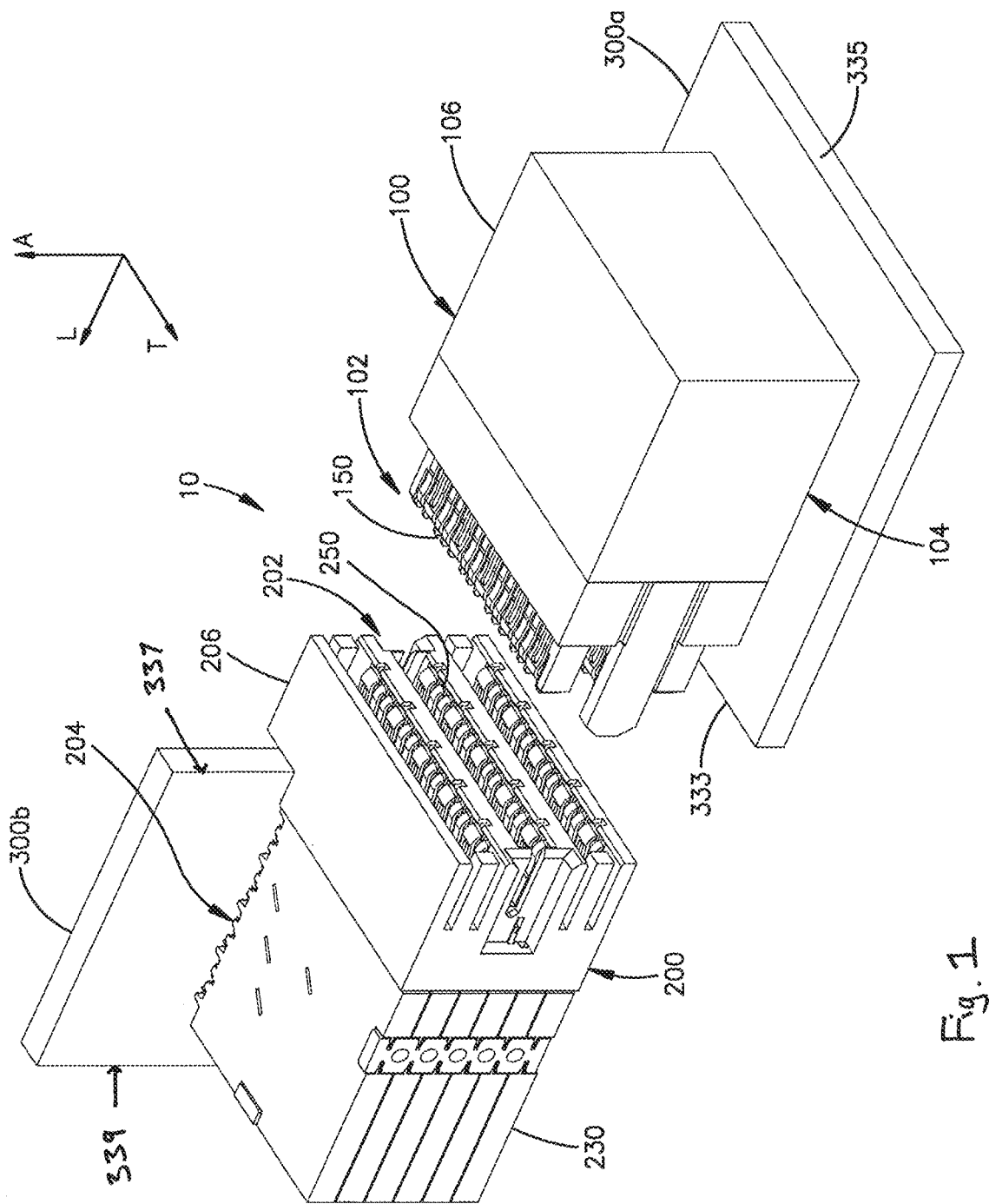
FIG. 1 is a perspective view of an electrical connector assembly in accordance with one embodiment.

The figures illustrate exemplary embodiments of such a connector and corresponding footprints. Referring to FIG. 1, an electronic assembly 10 includes a first electrical connector 100, a second electrical connector 200 configured to be mated with the first electrical connector 100, a first substrate configured as a first printed circuit board 300a, and a second substrate configured as a second printed circuit board 300b. For instance, the first printed circuit board 300a can be configured as a backplane, or alternatively can be configured as a midplane, daughter card, or any suitable alternative electrical component. The second printed circuit board 300b can be configured as a daughter card, or can alternatively be configured as a backplane, a midplane, or any suitable alternative electrical component. In the embodiment illustrated, printed circuit board 300a and 300b are mounted in an orthogonal configuration.

The first electrical connector 100 may be configured to be mounted to the first printed circuit board 300a so as to place the first electrical connector 100 in electrical communication with the first printed circuit board 300a. Similarly, the second electrical connector 200 may be configured to be mounted to the second printed circuit board 300b so as to place the second electrical connector 200 in electrical communication with the second printed circuit board 300b. The first and second electrical connectors 100 and 200 are further configured to be mated with each other along a mating direction so as to place the first electrical connector 100 in electrical communication with the second electrical connector 200. The mating direction can, for instance, comprise a longitudinal direction L. Accordingly, the first and second electrical connectors 100 and 200 can be mated to one another so as to place the first printed circuit board 300a in electrical communication with the second printed circuit board 300b.

The first electrical connector 100 may have a mating interface 102 and a mounting interface 104. Similarly, the second electrical connector may have a mating interface 202 and a mounting interface 204. The first electrical connector 100 and the second electrical connector 200 are configured to mate with each other at the respective mating interfaces 102 and 202. The first electrical connector 100 is configured to be mounted to the first printed circuit board 300a at the mounting interface 104. Similarly, the second electrical connector 100 is configured to be mounted to the second printed circuit board 300b at the mounting interface 104. In the illustrated embodiment, the first electrical connector 100 is a right-angle electrical connector whereby the mating interface 102 is oriented perpendicular with respect to the mounting interface 104. Other configurations are possible. The first electrical connector 100, for example, may be configured as a vertical electrical connector whereby the mating interface 102 is oriented parallel with respect to the mounting interface 104.

In the illustrated embodiment, the second electrical connector 200 is a right angle electrical connector whereby the mating interface 202 is oriented perpendicular with respect to the mounting interface 204. Other configurations are possible. The second electrical connector 200, for example, may be configured as a vertical electrical connector whereby the mating interface 202 is oriented parallel with respect to the mounting interface 204.

As illustrated in FIG. 1, when the first electrical connector 100 is mounted to the first printed circuit board 300a, the second electrical connector 200 is mounted to the second printed circuit board 300b, and the first and second electrical connectors 100 and 200 are mated with each other, the mounting interfaces 104 and 204 are oriented orthogonal with respect to each other. Thus, it can be said that the first and second electrical connectors 100 and 200 are orthogonal with respect to each other when mated to each other.

It should be appreciated, of course, that the electrical connector assembly 10 can be alternatively constructed in any manner desired. For instance, the electrical connector assembly 10 can be a co-planar electrical connector assembly whereby the first and second electrical connectors 100 and 200 are constructed such that the first and second printed circuit boards 300a and 300b are oriented along planes that are each formed by the same two directions, such as the longitudinal direction L and the lateral direction A. Thus, the mounting interfaces 104 and 204 can also be formed by the same two directions that are perpendicular to each other, such as the longitudinal direction L and the lateral direction A. Alternatively still, one of the first and second electrical connectors 100 and 200 can be configured as a vertical connector, while the other of the first and second electrical connectors 100 and 200 can be configured as a right angle connector, such that the first and second printed circuit boards 300a and 300b are oriented perpendicular with respect to each other. For instance, one of the mounting interfaces 104 and 204 can be oriented in a plane formed by the lateral direction A and the transverse direction T, and the other of the mounting interfaces 104 and 204 can be oriented in a plane formed by the longitudinal direction L and the lateral direction A. As another alternative, at least one of the first and second electrical connectors may be configured to mate with an electrical connector connected to a cable.

The longitudinal direction L and the transverse direction T can be oriented in a horizontal direction, and the lateral direction A can be oriented in a vertical direction, though it should be appreciated that these directions may change depending, for instance, on the orientation of the electrical connector assembly 10 during use. For example, the longitudinal direction L may be arranged in the plane of the printed circuit board 300b, perpendicular to the card edge 337. The lateral direction A may be arranged in the plane of the printed circuit board 300b, parallel to the card edge 337. The transverse direction T may be arranged normal to the printed circuit board 300b. Unless otherwise specified herein, the terms "lateral," "longitudinal," and "transverse" as used to describe the orthogonal directional components of various components and do not limit to specific differential signal pair configurations. Further, the term "inward," "inner," "inboard," and words of similar import refer to a direction toward a center of a structure, while the terms "outward", "outer," "outboard" and words of similar import refer to a direction away from the center of the structure.

Figure 2:
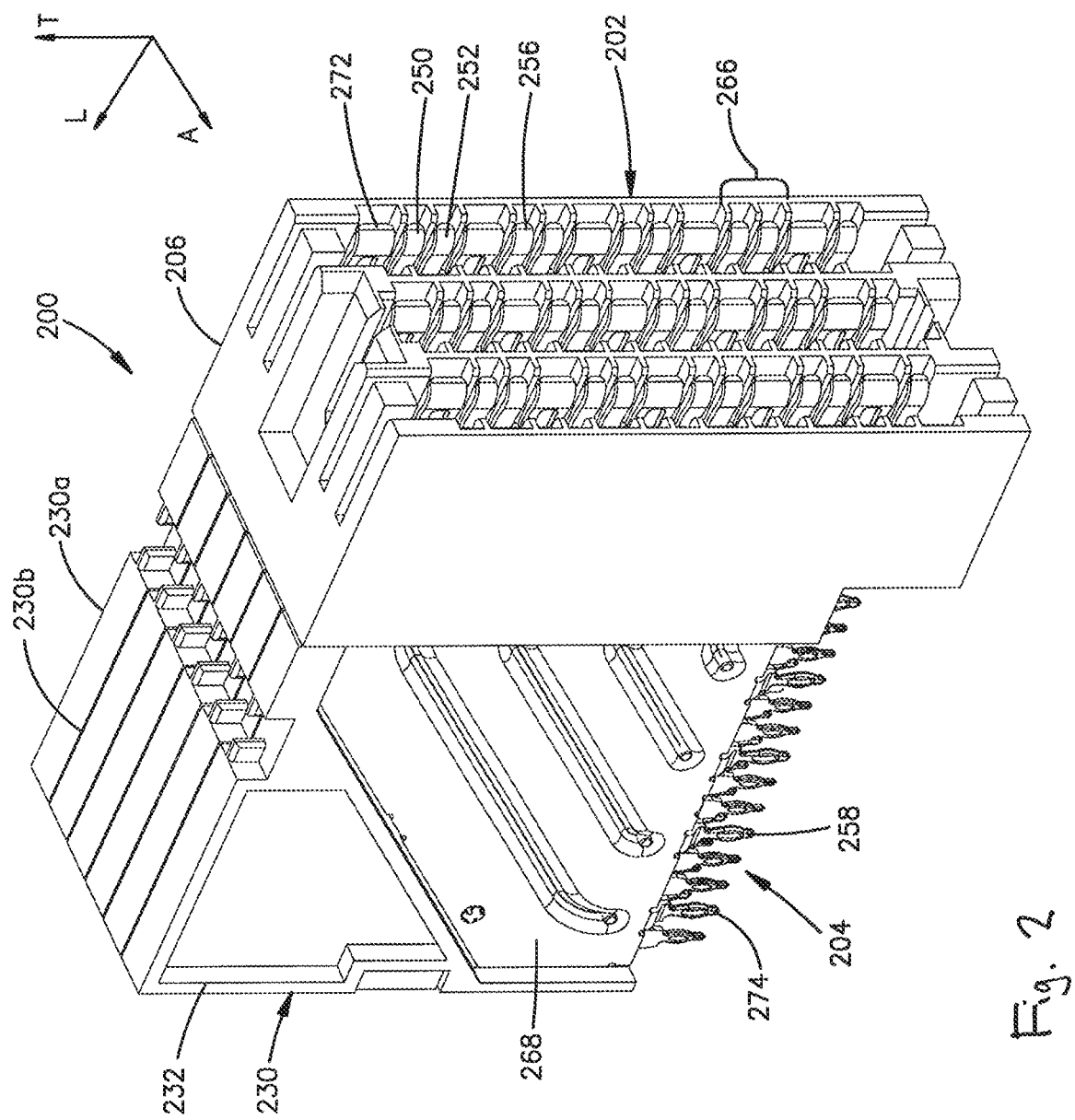
FIG. 2 is a perspective view of an electrical connector in accordance with one embodiment.

As shown in FIG. 2, the second electrical connector 200 may include a dielectric, or electrically insulative connector housing 206. As shown, housing 206 is mounted at an edge 337 of printed circuit board 300a. A surface of housing 206 may press against the edge. A plurality of electrical contacts 250 may be supported by the connector housing 206. For instance, the second electrical connector 200 can include a plurality of leadframe printed circuit board 3000b, and has a portion assemblies 230 that include respective dielectric or electrically insulative leadframe housings 232 and select ones of the plurality of electrical contacts 250, such as signal contacts 252, supported by the leadframe housings 232. In some embodiments, leadframe assemblies 230 may comprise wafers. Thus, the signal contacts 252 can be supported by respective ones of the leadframe housings 232 which, in turn, are supported by the connector housing 206. Alternatively, the electrical signal contacts 252 can be supported directly by the connector housing 206. The signal contacts 252 can be overmolded by respective ones of the leadframe housings 232, or can alternatively be stitched into the leadframe housings 232.

Each of the leadframe assemblies 230 may further include a ground plate 268 that is supported by the leadframe housing 232. The ground plate 268 may be electrically conductive. The ground plate 268 can be metallic. The ground plate 268 can include an electrically conductive or nonconductive lossy material. Thus, the ground plate 268 can form a shield that reduces crosstalk between adjacent ones of the leadframe assemblies 230. The ground plate 268 can include ground mating ends 272 and ground mounting ends 274. The signal contacts 252, the ground mating ends 272, and the ground mounting ends 274 can be included in the plurality of electrical contacts 250.

Conductive elements may be made of metal or any other material that is conductive and provides suitable mechanical properties for conductive elements in an electrical connector. Phosphor-bronze, beryllium copper and other copper alloys are non-limiting examples of materials that may be used. The conductive elements may be formed from such materials in any suitable way, including by stamping and/or forming.

The plurality of electrical contacts 250 can include a plurality of signal contacts 252 that form respective mating ends 256 and mounting ends 258 opposite the mating ends 256. Similarly, the plurality of electrical contacts 250 can include a plurality of ground mating ends 272 and ground mounting ends 274 opposite the ground mating ends 272. The ground mating ends 272 and ground mounting ends 274 can be monolithic with respective ones of a plurality of electrically conductive ground plates 268. Alternatively, the ground mating ends 272 and the ground mounting ends 274 can each be formed by respective individual electrical ground contacts as desired. The mating ends of the electrical contacts 250 can include the mating ends 256 and the ground mating ends 272. Similarly, the mounting ends of the electrical contacts 250 can include the mounting ends 258 and the ground mounting ends 274.

In some embodiments, mounting ends of electrical contacts 250 may be arranged in at least one column. In some embodiments, a column comprises the signal mounting ends of a single leadframe assembly. In some embodiments, a column is arranged along a column direction, which, in the illustrative embodiment of FIG. 2, is perpendicular to the card edge 337. Mounting ends arranged in the same column may be offset along a row direction which is perpendicular to the column direction, in FIG. 2, parallel to the edge 337. For example, a column may have a column width in the row direction, within which the mounting ends lie. In some embodiments, the column width of each column is formed by two outermost, along the row direction, mounting ends of the column. In some embodiments, column widths of adjacent columns may not overlap in the row direction. In some embodiments, each mounting end may comprise a portion arranged in a respective plane. In some embodiments, the respective planes may be parallel to the column direction and perpendicular to a plane of a printed circuit board to which the connector is configured to be mounted. Alternatively, at least one of the respective planes may be arranged in a different configuration. For example, a plane of a mounting end may be arranged at a 45 degree angle to the column direction and perpendicular to the circuit board. The present disclosure is not limited in this respect, and other orientations of the respective planes relative to the column direction and the circuit board are possible and within the scope of the disclosure.

The ground mounting ends 274 may comprise a bent portion such that the ground mounting ends of a column lie at least partially in the same plane as signal mounting ends of the column. In other embodiments, at least one ground mounting end of a column may be offset in the row direction from a pair of signal mounting ends of the column. The mounting ends of the electrical contacts 250 can be configured as desired so as to be placed in electrical communication with respective mounting locations of the second printed circuit board 300b. For instance, the mounting ends of the electrical contacts 250 can be configured as press-fit tails, surface mount members, or can include fusible elements such as solder balls.

In some embodiments, a leadframe assembly may comprise a column of conductive elements configured as signal conductors. These signal conductors may be shaped and spaced to form single ended signal conductors. However, in the embodiment illustrated in FIG. 2, the signal conductors are shaped and spaced in pairs to provide differential signal conductors. Each of the columns may include or be bounded by conductive elements serving as ground conductors. It should be appreciated that ground conductors need not be connected to earth ground, but are shaped to carry reference potentials, which may include earth ground, DC voltages or other suitable reference potentials. The "ground" or "reference" conductors may have a shape different than the signal conductors, which are configured to provide suitable signal transmission properties for high frequency signals. For example, in some embodiments, ground conductors will be wider than signal conductors and/or signal conductors may be routed closer to each other than to an adjacent ground conductor.

Leadframe assemblies may be formed in any suitable way. In some embodiments, the leadframe assemblies may be formed by stamping columns of conductive elements from a sheet of metal and over molding dielectric portions on the intermediate portions of the conductive elements. In other embodiments, leadframe assemblies may be assembled from modules each of which includes a single, single-ended signal conductor, a single pair of differential signal conductors or any suitable number of single ended or differential pairs.

The spacing between adjacent columns of conductors may be within a range that provides a desirable density and desirable signal integrity. As a non-limiting example, the conductors may be stamped from 0.4 mm thick copper alloy, and the conductors within each column may be spaced apart by 2.25 mm and the columns of conductors may be spaced apart by 2.4 mm. However, a higher density may be achieved by placing the conductors closer together. In other embodiments, for example, smaller dimensions may be used to provide higher density, such as a thickness between 0.2 and 0.4 mm or spacing of 0.7 to 1.85 mm between columns or between conductors within a column. Moreover, each column may include four or more (e.g., eight) pairs of signal conductors, such that it density of 60 or more pairs per linear inch is achieved for the interconnection system illustrated in FIG. 1. However, it should be appreciated that more pairs per column, tighter spacing between pairs within the column and/or smaller distances between columns may be used to achieve a higher density connector.

The mating ends of the electrical contacts 250 of each of the leadframe assemblies 230 can be arranged and aligned along a column direction, which may be in the transverse direction T in accordance with the illustrated embodiment. The electrical contacts 250 may be arranged such that adjacent ones of the electrical signal contacts 252 along the column direction form pairs 266. The leadframe assemblies 230 can be disposed adjacent each other along a row direction that is perpendicular to the column direction. The row direction may comprise the lateral direction A. Each pair 266 of electrical signal contacts 252 can form a differential signal pair. Each of the ground mating ends 272 can be disposed adjacent mating ends 256 of the pairs of electrical signal contacts 252 along the column direction. For instance, ones of the ground mating ends 272 can be disposed between immediately adjacent ones of the pairs 266 of electrical signal contacts 266 along the column direction. Similarly, each of the ground mounting ends 274 can be disposed adjacent ones of the mounting ends 258 of the pairs 266 of electrical signal contacts 252 along respective linear arrays that are oriented in a direction that is perpendicular to the column direction. For instance, the linear array direction can be the longitudinal direction L.

The electrical contacts 250 can be constructed as right angle contacts, whereby the mating ends are oriented perpendicular to the mounting ends. For instance, the mating ends of the electrical contacts 250 of each leadframe assembly 230 can be spaced from each other in a select direction, and the mounting ends of the electrical contacts 250 of each leadframe assembly 230 can be spaced from each other in a second direction that is perpendicular to the select direction. For instance, the select direction can be the transverse direction T. The second direction can be the longitudinal direction L. Alternatively, the electrical contacts 250 can be orthogonal as described above with respect to electrical contacts of the first electrical connector 100. Alternatively still, the mating ends of the electrical contacts 150 can be configured as vertical contacts, whereby the mating ends are oriented parallel to the mounting ends.

The electrical contacts 250 in each column may form a repeating contact pattern, including S-S-G, G-S-S, S-G-S, or any suitable alternative contact pattern, where "S" represents an electrical signal and "G" represents a ground. The plurality of leadframe assemblies 230 can include at least one first leadframe assembly 230a, including a plurality of first leadframe assemblies 230a, that can each form a first repeating contact pattern. The plurality of leadframe assemblies 230 can include at least one second leadframe assembly 230b, including a plurality of second leadframe assemblies 230b, that can each form a second repeating contact pattern that is the same or different than the first repeating contact pattern. For instance, the first repeating contact pattern of G-S-S along the column direction. The outermost electrical contact 250 along the column can be a single widow contact that can be overmolded by the leadframe housing or stitched into the leadframe housing as described with respect to the electrical signal contacts 252. It should be appreciated for the purposes of clarity that reference to the signal contacts 252 includes the single widow contacts. The second repeating contact pattern can be a G-S-S pattern along the second direction, such that the outermost electrical contact 250 along the column can be a single widow contact. The single widow contact of the second leadframe assemblies 230b that is disposed opposite the widow contact of the first plurality of leadframe assemblies 230a. The single widow contacts can be single-ended signal contacts, low speed or low frequency signal contacts, power contacts, ground contacts, or some other utility contacts.

According to one embodiment, the electrical connector 100 is constructed using techniques similar to those use to make the electrical connector 200. For example, connector 100 similarly has an insulative housing and conductive elements. Connector 100 may comprise similar leadframe assemblies. However, connector 100 may be configured differently than connector 200. For example, connector 100 may comprises mating ends of conductors in rows parallel to a front card edge rather than in columns perpendicular to the front card edge. The electrical connector 100 may differ from the electrical connector 200 in that that is may be configured to receive at least a portion of the electrical connector 200 such that a portion of the electrical connector 100 at least partially surrounds a portion of the electrical connector 200 when the first and second electrical connectors 100 and 200 are arranged in a mated configuration.

Referring again to FIG. 1 the first and second connectors 100 and 200 are configured to mate directly to each other at their respective mating interfaces 102 and 202. Accordingly, the electrical contacts 150 and 250 can mate directly to each other. Thus, the electrical contacts 150 and 250 physically and electrically connect to each other at their respective mating ends. That is, mating ends of the first electrical connector 100 and the mating ends 256 physically touch each other when the first and second electrical connectors 100 and 200 are mated to each other. Further, ground mating ends of the second electrical connector 100 and the ground mating ends 272 physically touch each other when the first and second electrical connectors 100 and 200 are mated to each other. In accordance with one embodiment, the electrical contacts 150 of first leadframe assemblies of the first electrical connector 100 mate with the electrical contacts 250 of the first leadframe assemblies 230a. Similarly, the electrical contacts 150 of second leadframe assemblies of the first electrical connector 100 mate with the electrical contacts 250 of the second leadframe assemblies 230b.

Figure 3:
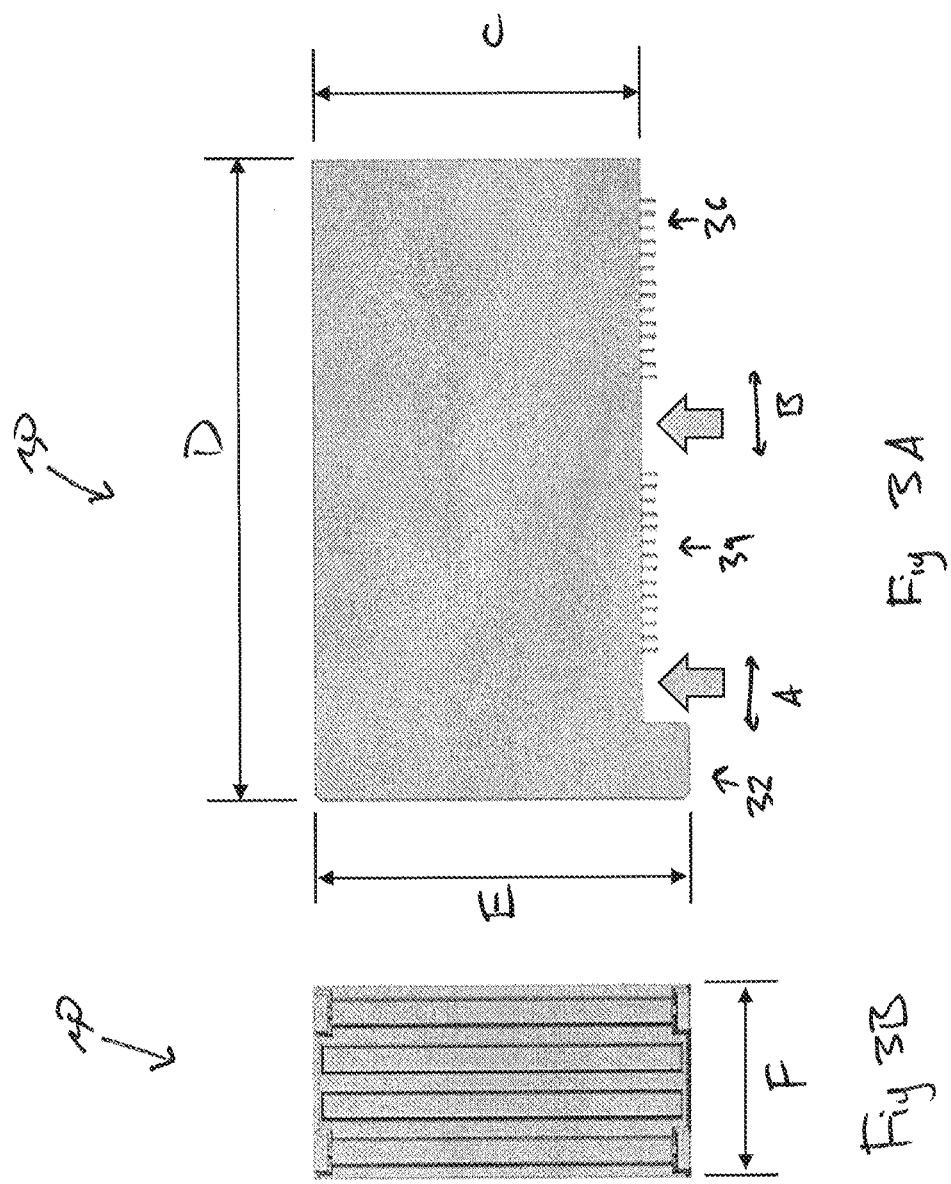
FIG. 3A is a side view of an electrical connector in accordance with one embodiment.
FIG. 3B is a front view of the electrical connector of FIG. 3A.

Referring now to FIGS. 3A-3B, an electrical connector 30 configured to reduce the number of routing layers required in a printed circuit board to which the connector is mounted. The electrical connector 30 may be, for example, configured as the second electrical connector 200. The electrical connector 30 may include a front portion 32 of the electrical connector, which may be arranged adjacent to a card edge such as a front card edge. The front portion may be arranged to overhang a card edge. The electrical connector 30 includes a first group of electrical contacts 34 and a second group of electrical contacts 36. The first and second groups of electrical contacts 34 and 36 may comprise mounting ends and may be configured to mount to a printed circuit board. Electrical connector 30 may provide an arrangement of 8 rows by 8 columns of pairs of signal contacts. The pairs may be arranged along a column direction.

The electrical connector 30 may also include a first group of electrical contacts 34 and a second group of electrical contacts 36.

FIG. 3A is a side view showing mounting portions of contacts within a column. In this example, the mounting portions are edge coupled. As shown in FIG. 3A, which is a side view of the electrical connector 30, there is gap within the column of having a distance A which may be formed between the front portion 32 of the electrical connector 30 and the first group of electrical contacts 34. In some embodiments, the distance A may be 5 millimeters (mm). In some embodiments, the distance A may be between 4 and 6 mm. A gap having distance B may be formed between first group of electrical contacts 34 and the second group of electrical contacts 36. In some embodiments, the distance B may be 10 mm. In some embodiments, the distance B may be between 8 and 12 mm. In some embodiments, the distance B has a width between 1.6 and 2.4 times the width of the distance A.

A distance C may be formed as a height of the electrical connector 30 not including the height of the front portion 32. In some embodiments, the distance C may be 32.3 mm. In some embodiments, the distance C may be between 26 and 39 mm. A distance D may be formed as a depth of the electrical connector 30 including the depth of the front portion 32. In some embodiments, the distance D may be 61.1 mm. In some embodiments, the distance D may be between 49 and 73 mm. A distance E may be formed as a height of the electrical connector 30 including the height of the front portion 32. In some embodiments, the distance E may be 36.9 mm. In some embodiments, the distance C may be between 30 and 44 mm.

As shown in FIG. 3B, which is a front view of the electrical connector 30, there is a distance F which may be formed as a width of the electrical connector 30. In some embodiments, the distance F may be 18.3 mm. In some embodiments, the distance F may be between 15 and 22 mm.

In some embodiments there may be an electrical connector formed using materials and techniques as described above with respect to connector 30. The connector may vary from connector 30 in that it may support an arrangement of 8 rows by 16 columns of pairs of signal contacts. The pairs may be arranged along a column direction. In such an embodiment, the distance F may be about 37 mm. In some embodiments, the distance F may be between 30 and 44 mm.

Figure 4:
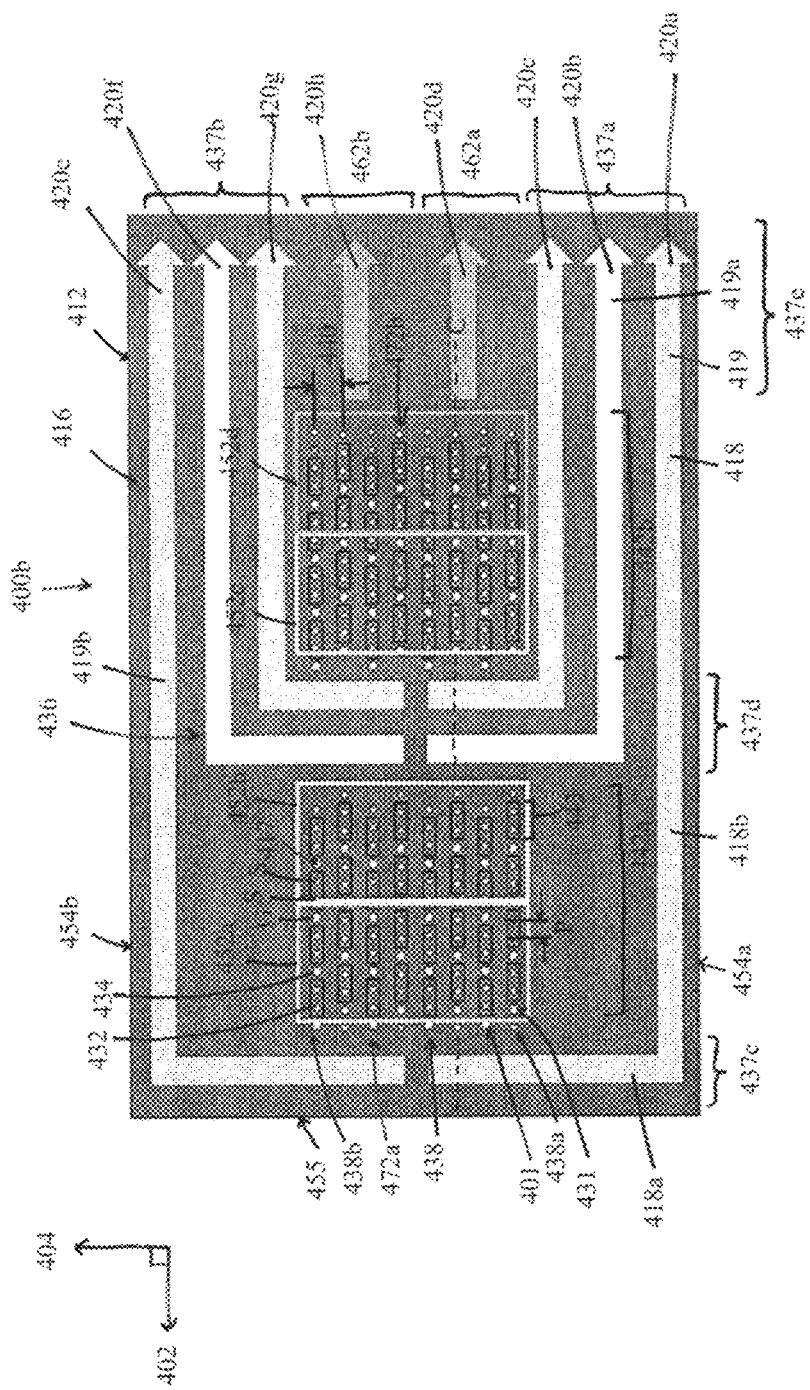
FIG. 4 is a top plan view of a printed circuit board in accordance with one embodiment.

Referring now to FIG. 4, a printed circuit board 400b to which a connector with gaps in the columns of mounting portions may be attached. Circuit board 400b may be an example of the first printed circuit board 300b illustrated in FIGS. 1-2. FIG. 4 illustrates vias for both signal and ground conductors. FIG. 4 also illustrates schematically routing channels. It should be appreciated that the routing channels may be below the surface of the printed circuit board, but they are shown in the FIG. 4, which may represent an interior layer of the printed circuit board. The printed circuit board 400b can include a dielectric or electrically insulative material, such as glass-filled or glass impregnated epoxy, electrical signal mounting locations supported by the electrically insulative material, and electrical ground mounting locations supported by the electrically insulative material. The signal mounting locations are configured to be placed in electrical communication with mounting portions of electrical signal contacts of the complementary electrical connector, and the ground mounting locations are configured to be placed in electrical communication with mounting portions of electrical ground contacts of the complementary electrical connector. For instance, the signal mounting portions can be configured as signal vias S that form respective electrically plated holes, and the ground mounting portions can be configured as ground vias G that form respective electrically plated holes. The signal vias S are configured to receive press-fit tails of electrical signal contacts of the complementary electrical connector, and the ground vias G are configured to receive press-fit tails of electrical ground contacts of the complementary electrical connector. It should be appreciated that the signal mounting portions and ground mounting portions can alternatively be configured as contact pads that are configured to be placed in contact with the respective mounting portions of the signal contacts and ground contacts of the complementary electrical connector that are surface mounted to the contact pads. The signal mounting portions are in electrical communication with respective signal traces 418 that are configured to route electrical signals along the printed circuit board 400b.

In accordance with the illustrated embodiment, the printed circuit board 400b can be generally planar along a first direction 402 and a second direction 404 that is perpendicular with respect to the first direction 402. For instance, when the second electrical connector 200 is an orthogonal electrical connector and mounted to the printed circuit board 400b, the first direction 402 can be along the longitudinal direction L, and the second direction 404 can be along the transverse direction T. When the second electrical connector 200 is a right-angle connector, the first direction 02 can be along the longitudinal direction L, and the second direction 404 can be along the lateral direction A. When the second electrical connector 200 is a vertical electrical connector, the first direction 402 can be along the lateral direction A, and the second direction 404 can be along the transverse direction T.

The printed circuit board 400b has a length that extends along the first direction 402 and a width that extends along the second direction 404. The length 402 can be equal to, greater than, or less than, the width 404. The printed circuit board 400b further has a thickness that extends along a third direction 406 that is perpendicular to each of the first direction 402 and the second direction 404. The printed circuit board 400b may comprise a plurality of (e.g., two) routing layers.

Figure 5:
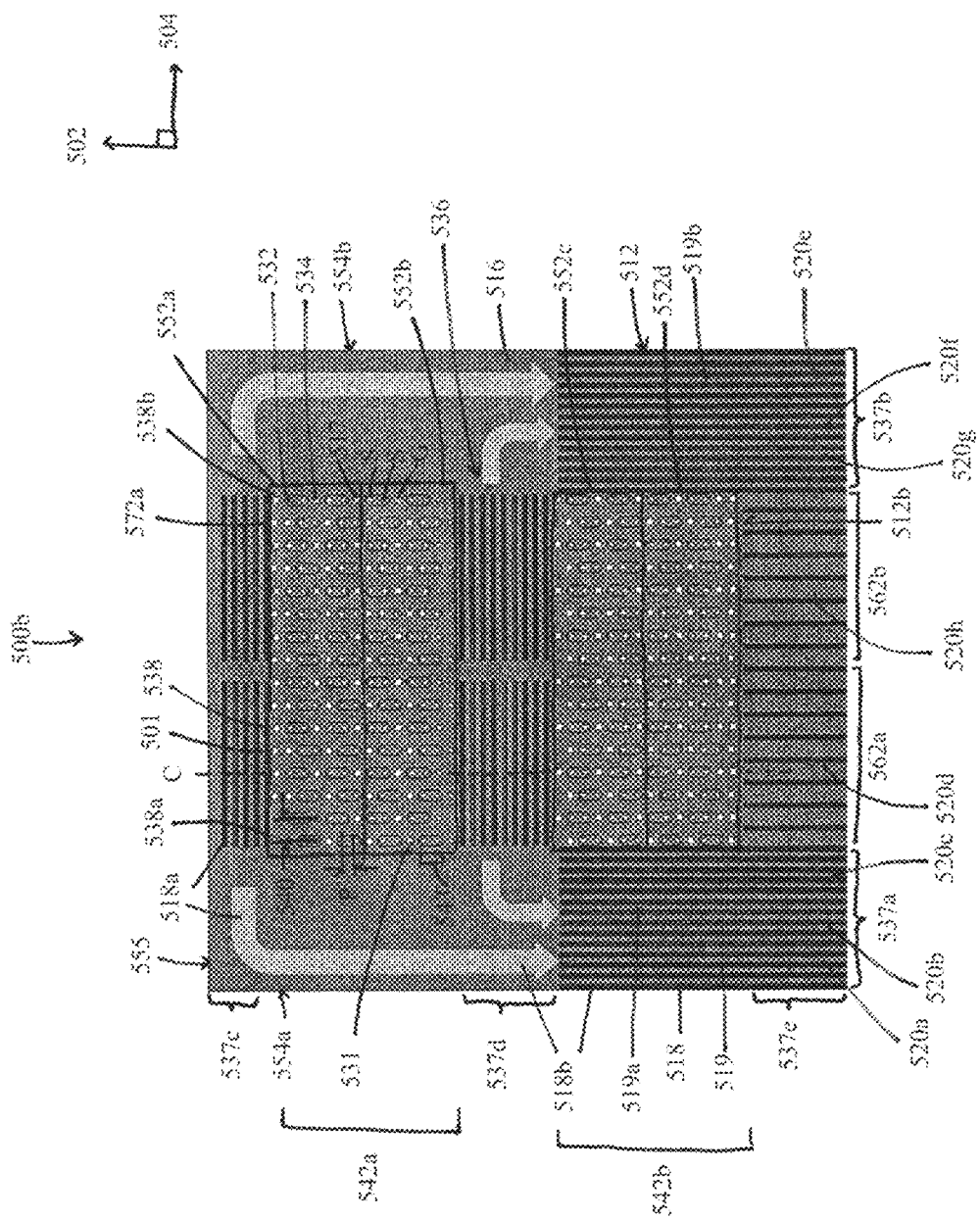
FIG. 5 is a top plan view of a printed circuit board in accordance with one embodiment.

FIG. 5 illustrates a printed circuit to which a connector with gaps, such as the illustrated in FIG. 3A, may be attached. As shown in FIG. 5, there is a printed circuit board 500b which may be formed using materials and techniques described with respect to printed circuit board 400b. Printed circuit board 500b may differ from printed circuit board 400b in that it is configured with a footprint configured to receive a 8 row by 16 column arrangement of pairs of signal contacts and may include three routing layers.

Figure 6:
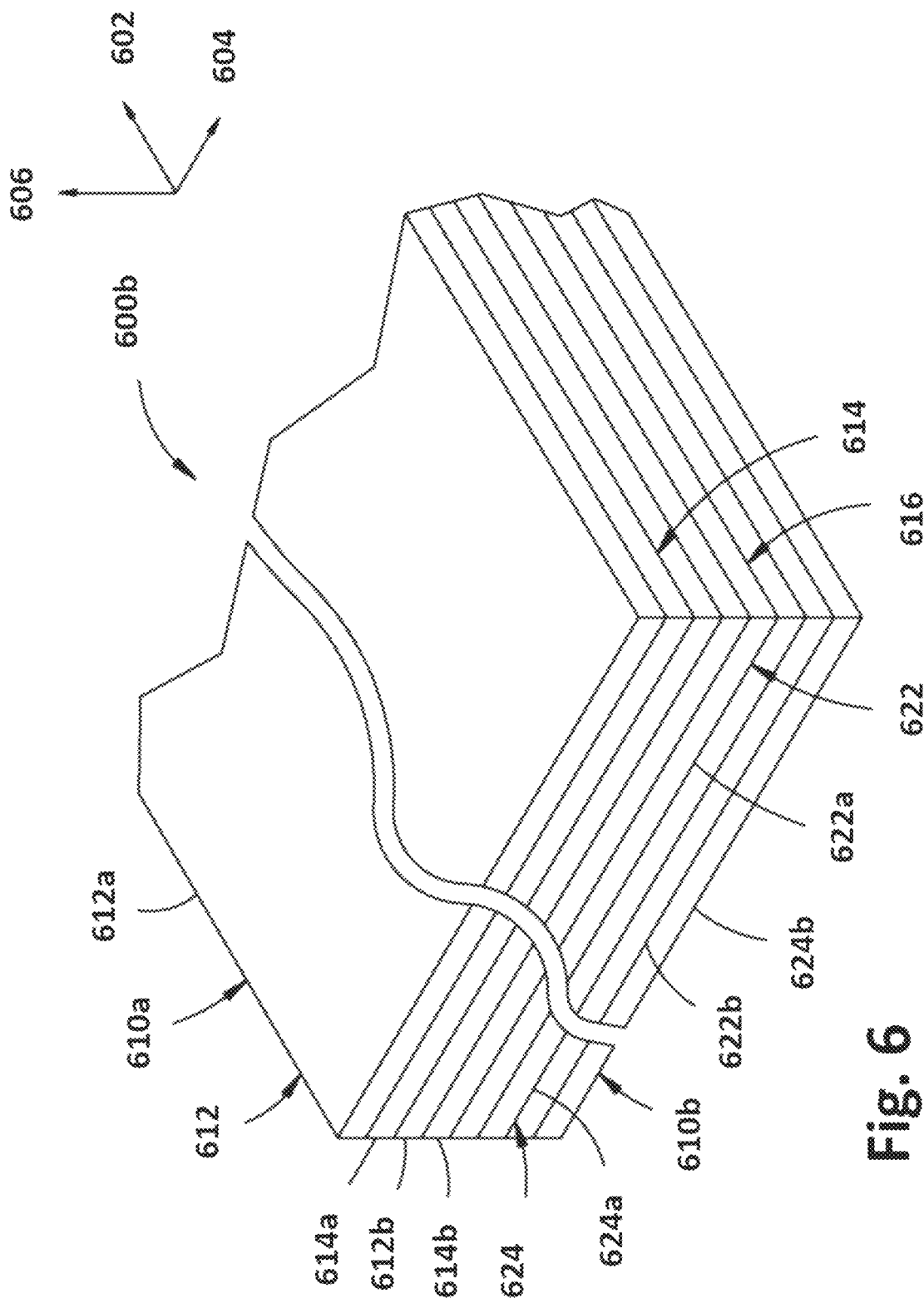
FIG. 6 is a perspective view of a portion of a printed circuit board in accordance with one embodiment.

Printed circuit boards 400b and 500b may be constructed in layers such as is shown in FIG. 6 in connection with printed circuit board 600b (described below) as well as to sections (e.g., sections 610a and 610b, described below) of the printed circuit board 600b including the respective electrically conductive layers and the respective electrically insulative layers. The width of the printed circuit board 400b can extend along the second direction 404 from a first side edge 454a to a second side edge 454b. The printed circuit board 400b can further include a card edge 455 that extends along the second direction 404 between the first side edge 454a and the second side edge 454b. For instance, the card edge 455 can extend along the second direction from the first side edge 454a to the second side edge 454b. In accordance with the illustrated embodiment, the card edge 455 can form the card edge 337 illustrated in FIG. 1A.

As described above, the printed circuit board 400b can have a plurality of mounting locations 401 that are configured to be placed in electrical communication with respective mounting ends of the electrical contacts 250 of the electrical connector 200. For instance, the mounting locations 201 can be configured as a plurality vias 431. The vias 431 can include electrical signal vias 432 and electrical ground vias 434. Each of the signal vias 432 and ground vias 434 can be configured as an electrically plated through hole. The signal vias 432 are configured to receive respective ones of the mounting ends 258 of the electrical signal contacts 252 so as to place the electrical signal contacts 252 in electrical communication with the respective signal vias 432. Similarly, the ground vias 434 are configured to receive respective ones of the ground mounting ends 274 so as to place the electrical signal contacts 252 in electrical communication with the ground plate 268 or individual ground contacts. It should be appreciated that while the signal vias 432 and ground vias 434 are configured to receive selective ones of the electrical contacts 450 of the first electrical connector 200, the signal vias 432 and the ground vias 434 can alternatively be configured to receive mounting ends of respective signal contacts and ground contacts of an auxiliary connector that is mounted to the printed circuit board 400b such that the printed circuit board 400b places the first electrical connector 200 in electrical communication with the auxiliary electrical connector. For instance, the first electrical connector 200 can be mounted proximate to one card edge 337, and the auxiliary connector can be mounted proximate to a second card edge 339 that is different than the first card edge 337.

For instance, the second card edge 339 can be opposite the card edge 337. The card edges 337 and 339 can each extend between the first side edge 454a and a second side edge 454b along the second direction 404, or can be located in any respective suitable alternatively locations of the printed circuit board 400b.

The signal vias 432 and the ground vias 434 can collectively be referred to as vias 431. It should be appreciated that reference herein to vias 431 need not be exposed in the surface and can alternatively be part of mounting locations 401 constructed in accordance with any suitable embodiment. For a connector with mounting portions of the signal and ground conductors constructed as surface mount contact tails the mounting locations 401 can be formed by an electrically conductive layer, for example, the first electrically conductive layer 612a (described below) overlaid on a via making a connection to inner layers within the board.

The vias 431, and thus the mounting locations 401, may form a footprint 436 of an electrical connector as described above. In some embodiments, the footprint may have columns which may be configured to receive the columns of the mounting ends of the connector 200 a described above. In one specific embodiment, shown in FIG. 4, the columns form a plurality of linear arrays 438 that can extend along the first direction 402. However, as described above with respect to the columns of mounting ends, the columns of the footprint may alternatively be arranged with at least one via offset perpendicular to the first direction relative to other vias of the column. Because the card edge 455 of the first printed circuit board 400b can form the card edge 337 illustrated in FIG. 1A, the first electrical connector 200 can be mounted at the footprint 436 such that the mounting ends of the first electrical connector 200 are inserted into respective ones of the vias 431 that form the footprint 436. Thus, the linear arrays 438 extend perpendicular to the card edge 455, and can form differential pairs of signal vias as is described in more detail below.

A center line that extends centrally through the vias 431 of one of the linear arrays 438 can extend along the first direction 404 and perpendicular to the card edge 455. The linear arrays 438 can be spaced from each other along the second direction 402. In the illustrative embodiment of FIG. 4, the plurality of linear arrays 438 comprises eight linear arrays. However, the number of linear arrays in not limited in this respect, and the plurality of linear arrays may comprise a different number of linear arrays. For example, in the illustrative embodiment of FIG. 5 (described below), the plurality of linear arrays comprises sixteen linear arrays. Referring again to FIG. 4, the linear arrays 438 can include a first plurality of linear arrays 438a and a second plurality of linear arrays 438b. The footprint 436 can be disposed proximate to the card edge 455. It should be appreciated that the footprint 436 can be spaced from the card edge 455 at any distance as desired. In one embodiment, the footprint 436 is spaced from the card edge 455 by a gap having the distance A.

The printed circuit board 400b can have a first margin or routing channel 437a that can be devoid of mounting locations 401 and vias 431. The first margin 437a can extend between the first side edge 454a and the footprint 436 along the second direction 404 or between the footprint 436 and an immediately adjacent footprint configured to receive an adjacent identical electrical connector. Similarly, the printed circuit board 400b can form a second margin 437b that is devoid of by mounting locations 401. The second margin or routing channel 437b can extend between the second side edge 454b and the footprint 436 along the second direction 404. Alternatively, the first and second margins 437a and 437b can form mounting locations that are not included in the footprint 436 of vias 431.

A connector with gaps, as shown for example in FIG. 3A, may lead to a smaller "aggregate footprint area" than a connector without such gaps. An "aggregate footprint area" may be the area of the connector footprint, including break-out portions of the traces (i.e., portions of the traces that extend from vias in the footprint to the edge of the footprint at the interior of the board) multiplied by the number of layers used to route those traces. For example, in FIG. 4, the area of the connector footprint extends in the first direction 402 from the card edge 455 to the side of the fifth margin 437e proximate the card edge 455, and extends in the second direction 404 from the side edge 454a (or an immediately adjacent footprint) to the side edge 454b (or an immediately adjacent footprint). In a case where the printed circuit board 400b comprises two routing layers, this area is multiplied by two to compute the aggregate footprint area.

The linear arrays of the first plurality of linear arrays 438a can be offset along the first direction 402 with respect to the linear arrays of the second plurality of linear arrays 438b. For instance, adjacent ones of the vias 431 of the respective linear arrays 438 can be spaced center-to-center along the second direction at a distance or pitch P. The linear arrays of the first plurality of linear arrays 438a can be offset along the first direction 402 with respect to the linear arrays of the second plurality of linear arrays 438b a distance less than or equal to the pitch P.

Further, each of the first and second pluralities of linear arrays 438a and 438b can include a respective repeating linear array pattern of ground vias 432 and signal vias 434 along the first direction 402, which can be referred to as a linear array direction. Each of the first plurality of linear arrays 438a can include a first repeating linear array pattern along the linear array direction. Each of the second plurality of linear arrays 438b can include a second repeating linear array pattern along the linear array direction. For instance, the first linear array pattern can include one or more of a repeating S-S-G-G configuration, a repeating S-S-G configuration, a repeating S-G configuration, a repeating S-G-S configuration, a repeating G-S-S configuration, a repeating G-S-S-G configuration, a repeating G-S-G-S configuration and a repeating G-S-G-S configuration, where "S" refers to a signal via 432, and "G" refers to a ground via 434. For instance, the second linear array pattern can include one or more of a repeating S-S-G-G configuration, a repeating S-S-G configuration, a repeating S-G configuration, a repeating S-G-S configuration, a repeating G-S-S configuration, a repeating G-S-S-G configuration, a repeating G-S-G-S configuration and a repeating G-S-G-S configuration, where "S" refers to a signal via 432, and "G" refers to a ground via 434. The first linear array pattern can be the same as or different than the second linear array pattern. Adjacent signal vias 432 along the linear array direction of each of the first and second pluralities of linear arrays 438a and 438b can form a differential signal pair 443 of vias. Adjacent ones of the differential signal pairs 443 can be separated from each other along the linear array direction by a ground via 434. In some embodiments the plurality of linear arrays 438 may include an orphan mounting locations 301, that is to say, signal vias at an end of a column which is not part of a pair.

Each of the first and second pluralities of linear arrays 438a and 438b can form a length along the first direction 402, and the respective first and second linear array patterns can repeat along the length of the corresponding linear array. The length can extend from one of the outermost vias of the respective linear array 438 along the linear array direction to the other one of the outermost vias of the respective linear array 438 along the linear array direction. The length of the linear arrays of the first plurality of linear arrays 438a can be equal to, greater than, or less than, the length of the linear arrays of the second plurality of linear arrays 438b. For one electrical connector, the respective lengths of the linear arrays 438 can be less than the length of the printed circuit board 400b along the first direction 402. Because the footprint 436 can include each of the linear arrays 438, the footprint 436 can extend along an area formed in the first direction 402 and the second direction 404. The first and second linear arrays 438a and 438b can be alternatingly arranged along the second direction 404.

The vias 431 of each of the linear arrays 438 can also be centered with respect to a respective array center line. For example, each array center line C can extend along the first direction 402 centrally through each of the vias of the respective one of the linear arrays. Adjacent ones of the linear arrays 438 can be spaced from each other along the second direction 404 by a gap 440. Further, as will be described in more detail below, the footprint 436 of vias 431 can be arranged in a first portion 442a and a second portion 442b. The first portion 442a may be between the card edge 455 and the second portion 442b. The first portion 442a may be spaced from the second portion 442b along the first direction 402. The first portion 442a may be spaced from the second portion 442b by the distance B. The first portion may include a first portion of each of the linear arrays 438, which may be a portion proximate the card edge 455. The second portion 442b may include a second portion of each of the linear arrays 438, which may be a portion distal the card edge 455. For instance, each mounting location 401 in the first portion 442a can be spaced a respective first distance from the card edge 455 along the first direction 402, and each mounting location 401 in the second portion 442b can be spaced a respective second distance from the card edge 455 along the first direction 402. Each of the first distances can be less than each of the second distances. It should be appreciated that each of the second distances can alternatively be less than each of the first distances. It should be further appreciated, in accordance with another embodiment, that at least one of the first distances can be greater or less than at least one of the second distances. The first portion of each linear array in the first portion 442a can comprise at least one signal via 432, such as at least one differential pair of signal vias 432. The second portion of each linear array of each linear array in the second portion 442b can also comprise at least one signal vias 432, such as at least one differential pair of signal vias 432. Further first portion of each linear array in the first portion 442a can have the same or a different number of linear arrays signal vias 432 with respect to the number of signal vias 432 of the second portions of each linear array in the second portion 442b.

Each of the vias 431 can form a respective hole 417 that extends along the third direction 406 at least partially through the printed circuit board 400b. Each hole 417 can be at least partially plated, including fully plated, with a conductive surface, such that each of the vias 431 can be referred to as a plated through-hole. Alternatively or additionally, each of the holes 417 can be partially filled with a conductive metal. Thus, each of the vias 431 can be referred to as an electrically conductive via. Further, each hole 417 can have a size and shape that is configured to receive a respective one of a the mounting ends of the plurality of electrical contacts of the complementary electrical connector that is mounted to the printed circuit board 400b, such as the first electrical connector 200 or the auxiliary electrical connector. Each of the vias 431 may have a circular cross section. Each hole 417 of the circular ground vias 434 and signal vias 432 may have a diameter which that extends in a plane that is formed in the first and second direction 402 and 404.

The ground vias 434 can be electrically coupled to, and thus can be in electrical communication with, one or more of first and second electrical ground layers, which may be configured as first and second ground layers 612b and 622b or additional electrical ground layers, as described below. For instance, the ground vias 432 of a first group of vias 431 can be electrically coupled to a first electrical ground layer. For instance, the electrically conductive material of the first electrical ground layer can contact an electrically conductive surface of the ground vias 434 of vias 431 in the first group. Additionally or alternatively, the ground vias 434 of the first group can be electrically coupled to a second electrical ground layer. For instance, the electrically conductive material of the second electrical ground layer can contact an electrically conductive surface of the ground vias 434 of vias 331 of the first group. Similarly, the ground vias 432 of a second group can be electrically coupled to a second electrical ground layer. For instance, the electrically conductive material of the second electrical ground layer can contact an electrically conductive surface of the ground vias 334 of the second group of vias 431. Additionally or alternatively, the ground vias 432 of the second group can be electrically coupled to the first electrical ground layer. For instance, the electrically conductive material of the first electrical ground layer can contact an electrically conductive surface of the ground vias 434 of the second group of vias 331.

An electrical signal layer, such as electrical signal layer 412 or 512, which may be configured as one of the electrical signal layers 612a, 622a, or an additional electrical signal layer, as described below, can include a plurality of electrical signal traces 418. For instance, the electrical signal layer 412 can include at least one routing channel 419 that contains at least one electrical signal trace 418. In accordance with one embodiment, the electrical signal layer 412 can include a plurality of routing channels 419 that each contain a plurality of electrical signal traces 418. The electrical signal traces 418 of the electrical signal layer 412 can be electrically coupled, that is in electrical communication with, respective ones of the signal vias 432 of the first group of vias 431. For example, each of the electrical signal traces 418 can contact an electrically conductive surface of a respective one of the signal vias 432 of the first group of vias 431. The electrical signal traces 418 of a second electrical signal layer 412 can be electrically coupled, that is in electrical communication with, respective ones of the signal vias 432 of the second group of vias 431. For example, the electrical traces 418 of the second electrical signal layer 422a can contact an electrically conductive surface of a respective one of the signal vias 432 of the second group of vias 431.

The plurality of linear arrays 438 may include a linear arrays on a first side 462a of the footprint and linear arrays on a second side 462b of the footprint. Linear arrays of the first side 462a and linear arrays of the second side 462b are spaced along the second direction 404. For instance, linear arrays of the first side 462a can each be spaced a respective first distance from the first side edge 454a or an immediately adjacent footprint along the second direction 404, and linear arrays of the second side 462b can each be spaced a respective second distance from the first side edge 454a or an immediately adjacent footprint along the second direction 404, where each of the first distances is less than each of the second distances. For example, in accordance with one embodiment, a linear array 438 of the first 462a which is an outermost linear array, i.e., closest to the side edge 454a or an immediately adjacent footprint, can at least partially form the first margin 437a, for instance in combination with the first side edge 454a or with a margin from an immediately adjacent footprint. Linear arrays of the second side 462b can each be spaced a respective first distance from the second side edge 454b or an immediately adjacent footprint along the second direction 404, and linear arrays of the first side 462a can each be spaced a respective second distance from the first side edge 454b or an immediately adjacent footprint along the second direction 404, where each of the first distances is less than each of the second distances. For example, in accordance with one embodiment, a linear array 438 which is an outermost linear array, i.e., closest to the side edge 454b or an immediately adjacent footprint, can at least partially form the second margin 437b, for instance in combination with the second side edge 454b or with a margin from an immediately adjacent footprint.

As described above, various ones of the signal traces 418 can be disposed in respective routing channels 419. For instance, the printed circuit board 400b can include a plurality of first routing channels 419a operatively associated with the linear arrays 338 of the first side 462a. Thus, the electrical traces 418 disposed in the first routing channels 419a can be electrically coupled to respective ones of the signal vias 432 of the linear arrays 338 of the first side 462a. The first side 462a may include at least one linear array. In the illustrative example of FIG. 4, the first side includes four linear arrays and the second side 462b includes 4 linear arrays. Thus, the first routing channels 419a may contain signal traces from all of the signal vias disposed in linear arrays 338 of the first side 462a. It should be appreciated that the first side 462a can include any number of linear arrays 438 as desired. Further, the first side 462a can have the same or a different number of linear arrays 438 respect to the number of linear arrays 438 disposed in the second side 462b.

At least some of the signal traces 418 may have first ends that are electrically connected to a respective ones of the signal vias 432. For instance, the first end can be physically coupled to the electrically conductive material of the respective ones of the signal vias 432. The first ends can extend first along the second direction 404 and then along first direction 402. The signal traces 418 can further include a first region 418a that extends relative to the first end along the second direction 404. For instance, the first region 418a can extend from the first end. The signal traces 418 can further include a second region 418b that extends relative to the first region 418a along a direction that is angularly offset with respect to the second direction 404. For instance, the second regions 418b can extend along the first direction 402. The second regions 418b can extend from the first regions 418a. The second regions 418b of the signal traces 418 that are in electrical communication with the respective signal vias of linear arrays 438 of the first side 462a can be disposed in the first margin 437a. The second regions 418b of the signal traces 418 that are in electrical communication with the respective signal vias of linear arrays 438 of the first side 462b can be disposed in the second margin 437b.

In some embodiments, the first portion 442a of the linear arrays may include a first sub-portion 452a and a second sub-portion 452b. Vias 431 of the first sub-portion can each be spaced a respective first distance from the card edge 455 along the first direction 402, and vias 431 of the second sub-portion 452b can each be spaced a respective second distance from the card edge 455 along the first direction 402, where each of the first distances is less than each of the second distances.

In some embodiments, the second portion 442b may include a third sub-portion 452c and a fourth sub-portion 452d. Vias 431 of the third sub-portion can each be spaced a respective first distance from the card edge 455 along the first direction 402, and vias 431 of the fourth sub-portion 452d can each be spaced a respective second distance from the card edge 455 along the first direction 402, where each of the first distances is less than each of the second distances.

Each portion of the linear arrays may include four pairs of signal vias per linear array. Each sub-portion of the linear arrays may include two pairs of signal vias per linear array.

In some embodiments, vias 431 of the first sub-portion 452a of the linear arrays which are most proximate the card edge 455 may at least partially bound a third margin 437d. For example, vias 431 of the first sub-portion 452a which are most proximate the card edge 455 and the card edge 455 may bound the third margin 437c.

In some embodiments, vias 431 of the second sub-portion 452b which are most distal the card edge 455 may at least partially bound a fourth margin 437d. Vias 431 of the third sub-portion 452c which are most proximate the card edge 455 may at least partially form a fourth margin 437d. For example, vias 431 of the second sub-portion 452b which are most distal the card edge 455 and vias 431 of the third sub-portion 452c which are most proximate the card edge 455 may form the fourth margin 437d.

In some embodiments, vias 431 of the fourth sub-portion 452a which are most distal the card edge 455 may at least partially bound a fifth margin 437e. For example, vias 431 of the fourth sub-portion 452d which are most distal the card edge 455 and a rear card edge, additional traces, other circuitry, or other devices disposed on or in the printed circuit board may bound the fifth margin 437e.

In the illustrative embodiment of FIG. 4, each of the margins is devoid of mounting locations 301 and vias 331. Accordingly, the margins may be used for routing channels for traces in the signal layers of the printed circuit board.

In some embodiments, the signal traces 418 can include a first plurality 420a of electrical signal traces 418, in electrical communication with signal vias 432 of the first side 462a and of the first sub-portion 437a. In some embodiments, the first regions 418a of the first plurality 420a of signal traces 418 can be disposed in the third margin 437c, and the second region 418b of the first plurality 420a of signal traces 418 can be disposed in the first margin 437a. Each of the signal traces 418 in the first plurality 420a signal traces may be nested.

In some embodiments, the signal traces 418 can include a second plurality 420b of electrical signal traces 418, in electrical communication with signal vias 432 of the first side 462a and of the second sub-portion 437b. In some embodiments, the first regions 418a of the second plurality 420b of signal traces 418 can be disposed in the fourth margin 437d, and the second region 418b of the second plurality 420b of signal traces 418 can be disposed in the first margin 437a. Each of the signal traces 418 in the second plurality 420b signal traces may be nested.

In some embodiments, the signal traces 418 can include a third plurality 420c of electrical signal traces 418, in electrical communication with signal vias 432 of the first side 462a and of the third sub-portion 437c. In some embodiments, the first regions 418a of the third plurality 420c of signal traces 418 can be disposed in the fourth margin 437d, and the second region 418b of the third plurality 420c of signal traces 418 can be disposed in the first margin 437a. Each of the signal traces 418 in the second plurality 420c signal traces may be nested.

In some embodiments, the signal traces 418 can include a fourth plurality 420d of electrical signal traces 418, in electrical communication with signal vias 432 of the first side 462a and of the fourth sub-portion 437d. In some embodiments the second region 418b of the fourth plurality 420d signal traces 418 can be disposed in the fifth margin 437e. Each of the signal traces 418 in the fourth plurality 420d of signal traces may be nested.

In some embodiments, the signal traces 418 can include a fifth plurality 420e of electrical signal traces 418, in electrical communication with signal vias 432 of the second side 462b and of the first sub-portion 437a. In some embodiments, the first regions 418a of the fifth plurality 420e of signal traces 418 can be disposed in the third margin 437c, and the second region 418b of the fifth plurality 420e signal traces 418 can be disposed in the second margin 437b. Each of the signal traces 418 in the fifth plurality 420e signal traces may be nested.

In some embodiments, the signal traces 418 can include a sixth plurality 420f of electrical signal traces 418, in electrical communication with signal vias 432 of the second side 462b and of the second sub-portion 437b. In some embodiments, the first regions 418a of the sixth plurality 420f of signal traces 418 can be disposed in the fourth margin 437d, and the second region 418b of the sixth plurality 420f signal traces 418 can be disposed in the second margin 437b. Each of the signal traces 418 in the sixth plurality 420f signal traces may be nested.

In some embodiments, the signal traces 418 can include a seventh plurality 420g of electrical signal traces 418, in electrical communication with signal vias 432 of the second side 462b and of the third sub-portion 437c. In some embodiments, the first regions 418a of the seventh plurality 420g signal traces 418 can be disposed in the fourth margin 437d, and the second region 418b of the seventh plurality 420g signal traces 418 can be disposed in the second margin 437b. Each of the signal traces 418 in the seventh plurality 420g signal traces may be nested.

In some embodiments, the signal traces 418 can include an eighth plurality 420h of electrical signal traces 418, in electrical communication with signal vias 432 of the second side 462b and of the fourth sub-portion 437d. In some embodiments the second region 418b of the eighth plurality 420h of signal traces 418 can be disposed in the fifth margin 437e. Each of the signal traces 418 in the eighth plurality 420h signal traces may be nested.

The first, second, third, and fourth pluralities 420a-d of signal vias may be nested. For example, the first plurality 420a may be disposed closest to a side edge 454a or an immediately adjacent footprint, along the second direction 404, followed by the second, third, and fourth pluralities 420b, 420c, and 420d.

Similarly the fifth, sixth, seventh, and eighth pluralities 420e-h of signal vias may be nested. For example, the eighth plurality 420h may be disposed closest to a side edge 454b or an immediately adjacent footprint, along the second direction 404, followed by the seventh, sixth, and fifth pluralities 420g, 420f, and 420e.

In some embodiments, signal traces 418 that are in electrical communication with the respective signal vias of the fourth sub-portion 452d may not include first regions 418a along the second direction 404 and may include a second regions 418b along the first direction 402. The majority of the second regions 418b which are in electrical communication with respective signal vias of the fourth sub-portion may be disposed primarily in the fifth margin 437e. At least a portion of all of the second regions 418b of all signal traces 418 may be disposed in the fifth margin 437e.

In some embodiments, each of the linear array 438 may include a first end 472a arranged proximate the card edge 455 and a second end 472b arranged distal the card edge 455. There may be at least one gap arranged in a linear array or column, between the front card edge 455 and the second end 472b of the linear array. In some embodiments, the gap is in excess of 4 mm. The linear array may be arranged as a column along the first direction, each column comprising pairs of signal vias. Each of the at least one gaps may be arranged spaced in the second direction 404 and aligned in the first direction 402 so as to form at least one of the third, fourth, and fifth margins 437c, 437d, and 437e.

A conductive structure may be separated from another conductive structure by a conductor-to-conductor spacing. A conductor-to-conductor spacing may be a distance between two adjacent conductive structures, including a minimum distance between the two conductive structures along a particular direction or axis. For example, a conductor-to-conductor spacing may be measured along a direction that a column or row of conductors extends. In some embodiments, a conductor-to-conductor spacing may be measured for a group of conductive structures, by identifying adjacent pairs of conductive structures and identifying a conductor-to-conductive spacing for each such adjacent pair. For example, a conductor-to conductor spacing of adjacent pairs of conductive structures may be a minimum distance between first conductive structures of a first pair and second conductive structures of a second pair, along a particular direction.

In some such embodiments, a gap (e.g., gaps discussed above, such as gaps in linear arrays or columns discussed above) may be arranged such that a dimension of the gap (e.g., a width of the gap) is greater than a conductor-to-conductor spacing of pairs of signal vias, or otherwise greater than a conductor-to-conductor spacing of pairs of mounting portions.

A conductor-to-conductor spacing may alternatively be measured as an edge-to-edge spacing between edges of adjacent conductive elements. However, other configurations of edge-to-edge-spacing are possible. For example, for two immediately adjacent pairs of signal vias arranged in the first direction 402, a first pair may be more proximate the card edge 455 and a second pair may be more distal the card edge 455. In such a case, the first pair may have a first edge of a signal via that is most distal the card edge 455 and the second pair may have a second edge of a signal via that is most proximate the card edge 455. In this arrangement, the edge-to-edge spacing may be the distance between the first edge and the second edge, along the first direction. In some such embodiments, the edge-to-edge spacing between adjacent pairs of contact tails or pairs of signal vias is less than 2.0 mm.

A conductor-to-conductor spacing may alternatively be measured as an edge-to-edge spacing of pairs of mounting portions of an electrical connector. For example, for pairs of mounting portions, there may be a first pair having a first outermost edge that faces a second pair, and the second pair may have a second outermost edge that faces the first pair. The distance between the first and second outermost edges may form the edge-to-edge spacing between the pairs of mounting portions.

In some such embodiments, a gap (e.g., gaps discussed above, such as gaps in linear arrays or columns discussed above) may be arranged such that a dimension of the gap (e.g., a width of the gap) may be greater than such an edge-to-edge spacing, such as an edge-to-edge spacing of pairs of signal vias.

It should be appreciated that a spacing between elements of an the electrical system may be measured in other ways. For example, an antipad-to-antipad spacing may be measured, which is a minimum distance between outer edges of antipads of two elements, including two conductive elements (e.g., two vias). As another example, a centerline-to-centerline spacing may be measured between centerlines of two elements, including two conductive elements (e.g., two vias). In some embodiments, a gap in a linear array or column (e.g., gaps discussed above) may be arranged such that a dimension of the gap (e.g., a width of the gap) is greater than an antipad-to-antipad spacing of pairs of signal vias, and/or greater than a centerline-to-centerline spacing of pairs of signal vias.

In first portions of linear arrays 438 in at least one portion, which may be the first portion 442a or the second portion 442b, the pairs of signal vias have an edge-to-edge spacing in the first direction of a first distance. The columns of vias may further comprise at least one gap which is free of signal vias, at a location between the card 455 edge and the second end 472b. The gap may span a distance in the first direction greater than the first distance. The gaps of each of the plurality of columns may align to form a routing channel extending in a second direction parallel to the edge, which may be disposed in one of the third or fourth margins 437c or 437d.

In some embodiments, the at least one gap comprises at least one of a first gap between the card edge 455 and the second end 472b and a second gap between the first end 472a and the second end 472b. The first gap may be disposed in or form the third margin 437c and the fourth gap may be disposed in or form the fourth margin 437d. The second gap may separate the first portion 442a and the second portion 442b. The first gap may have the distance A described above and the second gap may have the distance B described above. In the case where a connector such as connector 30 is mounted to the printed circuit board 400b, the first gap may be aligned with the gap between front portion 32 and the first group of electrical contacts 34. The second gap may be aligned with the cap formed between the first group of electrical contacts 34 and the second group of electrical contacts 36.

A portion, for instance a portion of the first region 418a or the second region 418b, of the signal traces 418 in electrical communication with respective ones of the signal vias 432 of the linear arrays 438 can be aligned along the third direction 306 with a portion, for instance a portion of the second region 318c, of other signal traces 418.

It should be appreciated that the signal traces 418 can include a signal trace that is connected to a signal via of one of the linear arrays 438. A portion the signal trace can be disposed between the respective one of the linear arrays 438 and an immediately adjacent one of the second linear array 438b. The first region of the signal traces can be disposed in one of the third or fourth margins 437c or 437d and the second region can be disposed in the first margin 437a or the fifth margin 437e, as described above. Similarly, the first region of the second signal trace can be disposed in one of the third or fourth margins 437c or 437 d and the second region may be disposed in the first margin 437a or the fifth margin 437e, as described above.

The printed circuit board 400b can have multiple layers each having at least one group of routing channels per layer. For example, a routing channel in electrical communication with signal vias of the first side 462a in the first margin 437a and a routing channel in electrical communication with signal vias of the second side 462b in the second margin 437b. The printed circuit board 400b can include at least one second routing channel 419b operatively associated with vias of the second side 462b. Thus, the electrical traces 418 disposed in the second routing channels 419b can be electrically coupled to respective ones of the signal vias 432 of the respective select ones of the second side 462b. It should be appreciated that the second side 462b can include any number of signal vias 332 as desired. Further, the second side 462b can have the same or a different number of signal vias 332 with respect to the number of signal vias 332 of the first side.

The first regions 418b of the signal traces 418 that are in electrical communication with the respective signal vias of the second side 462b extend in an opposite direction with respect to the first regions 418b of the signal traces 418 that are in electrical communication the respective signal vias of the first side 462a The ground layers may include antipad, through which signal vias 432 and ground vias not intended for connection to the ground layer, can pass without making connection to the ground layer.

The fourth sub-portion 452d can form outermost vias with respect to the first direction 402 that are spaced further than any other of the vias from the card edge 455 along the first direction 402. As described above with respect to the fifth margin 437e, the signal traces 418 in electrical communication with the signal vias 432 of the outermost vias 4 can extend from the respective signal vias 332 in the first direction, and thus parallel to the second regions 418b of other ones of the signal traces 418.

FIG. 5 shows an exemplary embodiment of a printed circuit board 500b which may be formed using materials and techniques described above with respect to printed circuit board 400b in FIG. 4. Printed circuit board 500b and elements thereof may differ from printed circuit board 400b and elements thereof in that printed circuit board is configured with a 8 row by 16 column arrangement of signal pairs 543 of vias 531. Additionally, while printed circuit board 400b may include two routing layers, printed circuit board 500b may include three routing layers.

A front card edge of printed circuit board may have a length of 62 mm allocated per connector footprint. In some embodiments, the length may be less than 65 mm and/or greater than 55 mm. If only one connector is mounted to the printed circuit board, this dimension may be the minimum width of the card. In an electrical system comprising a plurality of connectors with footprints 536, those connectors and associated footprints may have a pitch of similar dimensions.

In some embodiments, trace width may be between 3 and 6, such as 5, thousandths of an inch (mils). In some embodiments, intra-pair spacing may be between 5 and 9, such as 7 mils. In some embodiments, trace to antipad separation may be between 4 and 8, such as 6 mils. In some embodiments, centerline pitch between pairs of traces may be 40 mm.

In some embodiments, for the printed circuit board 500b, 14 pairs of signal traces can exit on each side. 15 pairs can exit straight out rear of footprint. There may be 43 total pairs per layer.

As shown in FIG. 6, there is a printed circuit board 600b which may comprise any of the printed circuit boards 300b, 400b, or 500b. The printed circuit board 600b may be arranged along first, second, and third directions 602, 604, and 606. The printed circuit board 600a can include at least a first section 610a and a second section 610b. However, it should be understood that the number of sections is not limited in this fashion. In some embodiments, a printed circuit board may comprise three or more sections each formed using materials and techniques as described with respect to portions 610a and 610b.

The first section 610a can include at least one electrically conductive layer 612, such as a plurality of electrically conductive layers 612. The electrically conductive layers 612 can include a first electrically conductive layer 612a and a second electrically conductive layer 612b. In one embodiment, the first and second conductive layers 612a and 612b can be consecutive electrically conductive layers. Thus, the second electrically conductive layer 612b can be disposed below the first electrically conductive layer 612a along the third direction 606. Accordingly, the first electrically conductive layer 612a can be referred to as an upper electrically conductive layer, and the second electrically conductive layer 612b can be referred to as a lower electrically conductive layer. Each of the first and second electrically conductive layers 612a and 612b can be substantially planar along respective planes that are formed by the first and second directions 602 and 604. However, it should be understood that the number of electrically conductive layers 612 is not limited in this fashion. In some embodiments, a portion may comprise three or more electrically conductive layers formed using materials and techniques as described above with respect to electrically conductive layers 612.

The first electrically conductive layer 612a can be configured as an electrical signal layer, and the second electrically conductive layer 612b can be configured as an electrically conductive ground layer. Because the first electrically conductive layer 612a is included in the first section 610a of the printed circuit board 600b, the first electrically conductive layer 612a can be used as a first electrical signal layer. Similarly, because the second electrically conductive layer 612b is included in the first section 610a of the printed circuit board 600b, the second electrically conductive layer 612b serve as a first electrical ground layer. The first electrical signal layer 612a can include an electrically insulative material such as insulative material 416, 516, or 616. The first electrical signal layer 612a can include at least one electrical signal trace which may be formed using materials and techniques as described above with respect to signal traces 418 or 518, or may include a plurality of such electrical signal traces, supported by the electrically insulative material. Differential signal traces of each pair are preferably spaced closer to each other than a spacing between immediately adjacent pairs of differential signal traces. For instance, the first electrical signal layer 612a can form a plurality of routing channels which may be formed using materials and techniques as described above with respect to routing channels 419 or 519. The routing channels may each contain at least a select one, such as select plurality, of electrical signal traces. The first electrical ground 612b can include an electrically conductive material that can be disposed between electrical signal layers so as to provide shielding between the electrical signal layers. The electrically conductive material of the first electrical ground layer 612b can be copper or any suitable alternative electrically conductive material.

The printed circuit board 600b can further include at least one dielectric or electrically insulative layer 614, such as a plurality of dielectric or electrically insulative layers 614 that are alternatingly arranged with the electrically conductive layers 612 along the third direction 606. Thus, the electrically insulative layers 614 are configured to electrically isolate two immediately adjacent ones of the consecutive conductive layers 612 from one another. The dielectric layers 614 may be comprised of any suitable electrically insulative material, such as such as glass-filled or glass impregnated epoxy, that prevents the flow of electricity therethrough. The electrically insulative layers 614 can include a first electrically insulative layer 614a and a second electrically insulative layer 614b. The first and second electrically insulative layers 614a and 614b can be arranged consecutively along the third direction 606. Thus, the second electrically insulative layer 614b can be disposed below the first electrically insulative layer 614a along the third direction 606. Accordingly, the first electrically insulative layer 614a can be referred to as an upper electrically insulative layer, and the second electrically insulative layer 614b can be referred to as a lower electrically insulative layer. Each of the first and second electrically insulative layers 614a and 614b can be substantially planar along respective planes that are formed by the first and second directions 602 and 604.

The electrically conductive layers 612 and the electrically insulative layers 614 can be alternatingly arranged with respect to each other along the third direction 606. Thus, the first electrically insulative layer 614a can be disposed between the first electrically conductive layer 612a and the second electrically conductive layer 612b. The second electrically conductive layer 612b can be disposed between the first electrically insulative layer 614a and the second electrically insulative layer 614b.

Similarly, the second section 610b can include at least one electrically conductive layer 622, such as a plurality of electrically conductive layers 622. The electrically conductive layers 622 can include a third electrically conductive layer 622a and a fourth electrically conductive layer 622b. In one embodiment, the third and fourth electrically conductive layers 622a and 622b can be consecutive electrically conductive layers. Thus, the fourth electrically conductive layer 622b can be disposed below the third electrically conductive layer 622a along the third direction 606. Accordingly, the third electrically conductive layer 622a can be referred to as an upper electrically conductive layer of the second section 610b, and the fourth electrically conductive layer 622b can be referred to as a lower electrically conductive layer of the second section 610b. Each of the third and fourth electrically conductive layers 622a and 622b can be substantially planar along respective planes that are formed by the first and second directions 602 and 604. However, it should be noted that the number of electrically conductive layers 622 is not limited in this fashion. In some embodiments, a portion may comprise three or more electrically conductive layers formed using materials and techniques as described above with respect to electrically conductive layers 622.

The third electrically conductive layer 622a can be configured as an electrical signal layer, and the fourth electrically conductive layer 622b can be configured as an electrically conductive ground layer. Because the third electrically conductive layer 622a is included in the second section 610b of the printed circuit board 600b, the third electrically conductive layer 622a can serve as a second electrical signal layer. Similarly, because the fourth electrically conductive layer 622b is included in the second section 610b of the printed circuit board 600b, the fourth electrically conductive layer 622b can be referred to as a second electrical ground layer. The second electrical signal layer 622a can include an electrically insulative material such as insulative material 416, 516, or 616. The first electrical signal layer 622a can include at least one electrical signal trace which may be formed using materials and techniques as described above with respect to single traces 418 or 518, or may include a plurality of such electrical signal traces, supported by the electrically insulative material. For instance, the second electrical signal layer 322a can form a plurality of routing channels which may be formed using materials and techniques as described above with respect to routing channels 419 or 519. The routing channels may each contain at least a select one, such as select plurality, of electrical signal traces. The second electrical ground 622b layer can include any suitable electrically conductive material. For instance, the electrically conductive material of the second electrical ground 622b can be copper or any suitable alternative electrically conductive material.

The printed circuit board 600b can further include at least one dielectric or electrically insulative layer 624, such as a plurality of dielectric or electrically insulative layers 624 that are alternatingly arranged with the electrically conductive layers 622 along the third direction 606. Thus, the electrically insulative layers 624 are configured to electrically isolate two immediately adjacent ones of the consecutive conductive layers 622 from one another. The dielectric layers 624 may be comprised of any suitable electrically insulative material, such as such as glass-filled or glass impregnated epoxy, that prevents the flow of electricity therethrough. The electrically insulative layers 624 can include a third electrically insulative layer 624a and a fourth electrically insulative layer 624b The third and fourth electrically insulative layers 624a and 624b can be arranged consecutively along the third direction 606, such that the fourth electrically insulative layer 624b can be disposed below the third electrically insulative layer 624a along the third direction 606. Accordingly, the third electrically insulative layer 624a can be referred to as an upper electrically insulative layer of the second section 610b and the fourth electrically insulative layer 624b can be referred to as a lower electrically insulative layer of the second section 610b. Each of the third and fourth electrically insulative layers 624a and 624b can be substantially planar along respective planes that are formed by the first and second directions 602 and 604.

The electrically conductive layers 622 and the electrically insulative layers 624 can be alternatingly arranged with respect to each other along the third direction 606. Thus, the third electrically insulative layer 624a can be disposed between the third electrically conductive layer 622a and the fourth electrically conductive layer 622b. The fourth electrically conductive layer 622b can be disposed between the third electrically insulative layer 624a and the fourth electrically insulative layer 624b.

Figure 7:
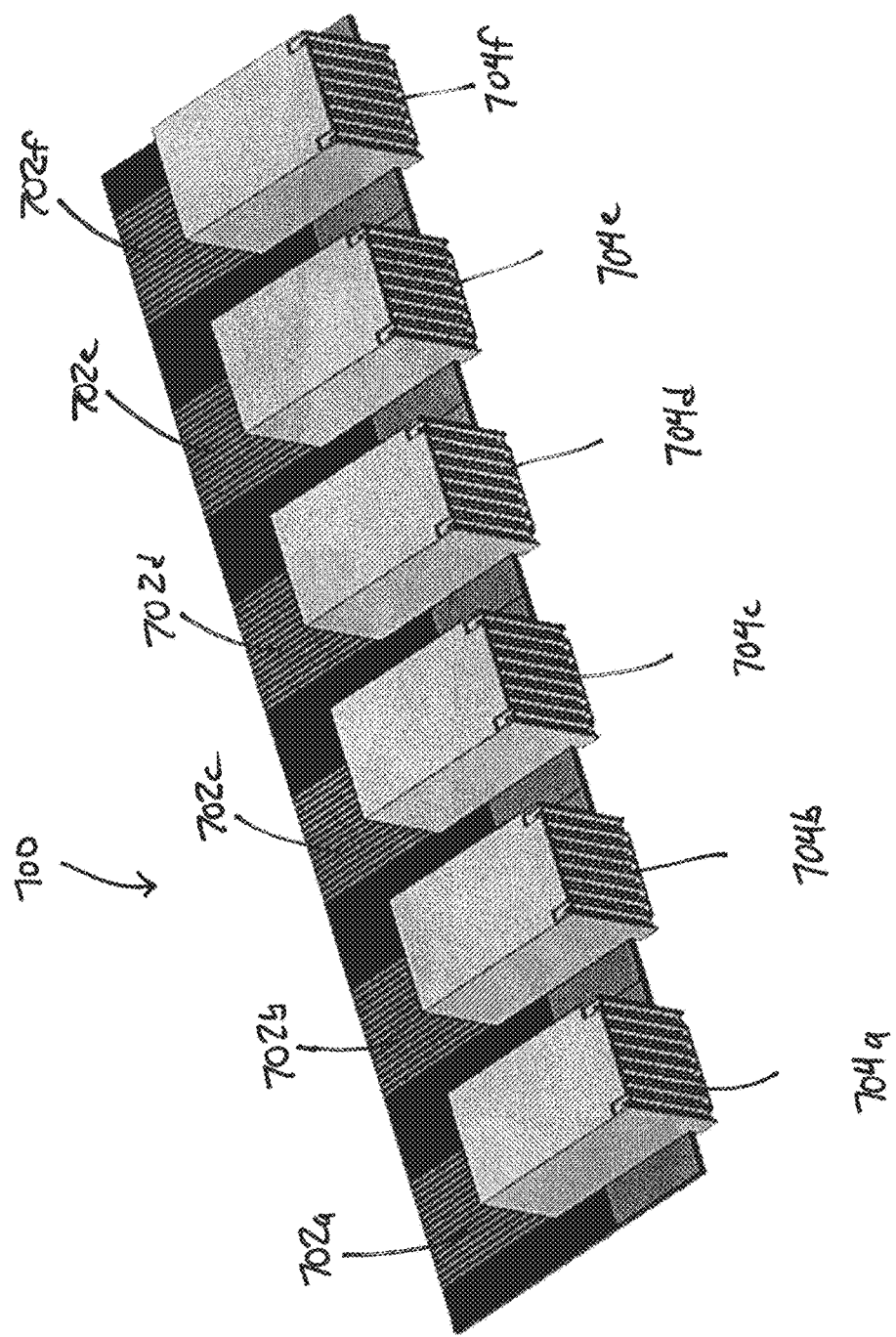
FIG. 7 is a perspective view of an electrical connector system in accordance with one embodiment.

According to aspects of the present application, there is provided a portion of an electronic system 700 as shown in FIG. 7. The electronic system 700 includes adjacent connector footprints 702a-f, which may be configured as footprints 436 or 536, and adjacent electrical connectors 704a-f which may be configured as electrical connector 200 or other connectors. FIG. 7 shows six adjacent footprints, however, the number of footprints is not limited in this manner and may be arranged as any number desired. FIG. 7 illustrates a tight pitch between connectors, which may be achieved with a connector with gaps in the columns of mounting portions, leading to a corresponding gaps in the connector footprint that serve as routing channels enabling a low number of signal layers.

In accordance with one embodiment, a method can be provided for routing signal traces. The method can include the step of fabricating the footprint 436 described above. Thus, the method can include the step of fabricating the signal traces 418 of the one or more electrical signal layers. The method can further include the step of fabricating one or more electrical ground layers in the manner described above. The method can further include the step of fabricating the signal vias 432 in the manner described above. The method can further include the step of fabricating the ground vias 434 in the manner described above. The method can further include teaching to a third party one or more of the above steps, teaching a third party a commercial advantage, such that routing layers can be reduced, and selling to the third party the printed circuit board 400b or 500b.

Having thus described several embodiments, it is to be appreciated various alterations, modifications, and improvements may readily occur to those skilled in the art. Such alterations, modifications, and improvements are intended to be within the spirit and scope of the invention. Accordingly, the foregoing description and drawings are by way of example only.

Various changes may be made to the illustrative structures shown and described herein. For example, examples of techniques are described for reducing the number of routing layers used in a connector footprint. These techniques may be used alone or in any suitable combination. Furthermore, the size of a connector may be increased or decreased from what is shown. Also, it is possible that materials other than those expressly mentioned may be used to construct the connector. As another example, connectors with eight differential signal pairs in a column are used for illustrative purposes only. Any desired number of signal conductors may be used in a connector.

Manufacturing techniques may also be varied. For example, in some embodiments, the connector 200 is formed by organizing a plurality of leadframe assemblies onto a stiffener. In some embodiments, an equivalent structure may be formed by inserting a plurality of shield pieces and signal receptacles into a molded housing.

As another example, connectors are described that are formed of modules, each of which contains one pair of signal conductors. It is not necessary that each module contain exactly one pair or that the number of signal pairs be the same in all modules in a connector. For example, a 2-pair or 3-pair module may be formed. Moreover, in some embodiments, a core module may be formed that has two, three, four, five, six, or some greater number of rows in a single-ended or differential pair configuration. Each connector, or each leadframe assembly in embodiments in which the connector comprises a plurality of leadframe assemblies, may include such a core module. To make a connector with more rows than are included in the base module, additional modules (e.g., each with a smaller number of pairs such as a single pair per module) may be coupled to the core module.

Furthermore, although many inventive aspects are shown and described with reference to a daughterboard connector having a right angle configuration, it should be appreciated that aspects of the present disclosure is not limited in this regard, as any of the inventive concepts, whether alone or in combination with one or more other inventive concepts, may be used in other types of electrical connectors, such as backplane connectors, cable connectors, stacking connectors, mezzanine connectors, I/O connectors, chip sockets, etc. Additionally, aspects of the present application may be applies in boards mating to a midplane.

In some embodiments, contact tails were illustrated as press fit "eye of the needle" compliant sections that are designed to fit within vias of printed circuit boards. However, other configurations may also be used, such as surface mount elements, spring contacts, solderable pins, etc., as aspects of the present disclosure are not limited to the use of any particular mechanism for attaching connectors to printed circuit boards.

In some embodiments, press fit tails may be "short," for example 0.31 mm+/−0.05. In some embodiments, the press fits have a working range of less than 0.36 mm.

The present disclosure is not limited to the details of construction or the arrangements of components set forth in the following description and/or the drawings. Various embodiments are provided solely for purposes of illustration, and the concepts described herein are capable of being practiced or carried out in other ways. Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

What is claimed is:

1. A printed circuit board comprising an edge, the printed circuit board comprising:
 a connector footprint comprising a plurality of signal vias adjacent the edge, wherein the plurality of vias are disposed in a plurality of columns extending in a first direction perpendicular to the edge from a first end adjacent the edge to a second end, each of the plurality of columns comprising a plurality of pairs of the plurality of signal vias;

wherein:
each of the plurality of columns comprises:
at least one portion in which the pairs of signal vias have a conductor-to-conductor spacing in the first direction of a first distance;
a gap, free of signal vias, at a location between the edge and the second end, the gap spanning a distance in the first direction greater than the first distance;
the gaps of the plurality of columns align to form a routing channel extending in a second direction parallel to the edge;
the printed circuit board further comprises at least one pair of signal traces routed in the routing channel, the at least one pair of signal traces being connected to a pair of vias in a column of the plurality of columns; and
the gap is between the edge and the first end of the column.

2. The printed circuit board of claim 1, wherein the gap is a first gap, and wherein each of the plurality of columns further comprises a second gap between the first end and the second end of the column.

3. The printed circuit board of claim 2, wherein:
each of the plurality of columns has a first portion comprising at least one pair of signal vias and a second portion comprising at least one pair of signal vias, and
the second gap is between the first portion and the second portion of the column.

4. The printed circuit board of claim 3, wherein:
the at least one pair of signal traces is at least one first pair of signal traces;
the second gap spans spanning a distance in the first direction greater than the first distance;
the second gaps of the plurality of columns align to form a second routing channel extending in a second direction parallel to the edge; and
the printed circuit board further comprises at least one second pair of signal traces routed in the second routing channel, the at least one pair of signal traces being connected to a pair of vias in a column of the plurality of columns.

5. The printed circuit board of claim 4, wherein:
the printed circuit board comprises a plurality of routing layers, including a first routing layer and a second routing layer;
each of the plurality of columns comprises 8 pairs of signal vias;
the plurality of columns comprises 8 columns,
each of the pairs of signal vias in each of the plurality of columns is connected to a pair of signal traces routed on the first routing layer or the second routing layer.

6. The printed circuit board of claim 5, wherein:
the connector footprint is a first connector footprint;
the printed circuit board comprises a second connector footprint and a center-to-center spacing of the first connector footprint and the second connector footprint is less than 65 mm.

7. The printed circuit board of claim 4, wherein:
the printed circuit board comprises a plurality of routing layers, including a first routing layer, a second routing layer and a third routing layer;
each of the plurality of columns comprises 8 pairs of signal vias;

the plurality of columns comprises 16 columns,
each of the pairs of signal vias in each of the plurality of columns is connected to a pair of signal traces routed on the first routing layer or the second routing layer or the third routing layer.

8. The printed circuit board of claim 4, wherein the second gap has a width between 1.6 and 2.4 times the width of the first gap.

9. The printed circuit board of claim 1, wherein a single pair of signal traces is routed between vias of adjacent columns.

10. The printed circuit board of claim 1, wherein an aggregate footprint area is less than 11500 mm$^2$ for a connector comprising 128 pairs of signal conductors.

11. A printed circuit board comprising an edge, the printed circuit board comprising:
a connector footprint comprising a plurality of signal vias adjacent the edge, wherein the plurality of vias are disposed in a plurality of columns extending in a first direction perpendicular to the edge from a first end adjacent the edge to a second end, each of the plurality of columns comprising a plurality of pairs of the plurality of signal vias;
wherein:
each of the plurality of columns comprises:
at least one portion in which the pairs of signal vias have a conductor-to-conductor spacing in the first direction of a first distance;
a gap, free of signal vias, at a location between the edge and the second end, the gap spanning a distance in the first direction greater than the first distance;
the gaps of the plurality of columns align to form a routing channel extending in a second direction parallel to the edge;
the printed circuit board further comprises at least one pair of signal traces routed in the routing channel, the at least one pair of signal traces being connected to a pair of vias in a column of the plurality of columns;
the footprint is a first footprint foot print;
the printed circuit board comprises a plurality of like footprints, including the first footprint, disposed along the edge of the printed circuit board;
the plurality of footprints are disposed on an average pitch between 55 and 65 mm.

12. An electrical connector of the type having a mating face configured to mate with a mating connector and a mounting face configured to face a printed circuit board when the connector is mounted to the printed circuit board, wherein the mounting face comprises an edge configured to align with an edge of the printed circuit board, the electrical connector comprising:
a housing;
a plurality of signal conductors held in the housing, the plurality of signal conductors comprising mating contact portions, contact tails and intermediate portions joining the contact tails to the mating contact portions, wherein the mating contact portions are disposed at the mating face of the connector;
wherein:
the plurality of contact tails are disposed in a plurality of columns extending in a first direction perpendicular to the edge of the mounting face from a first end adjacent the edge of the mounting face to a second end, each of the plurality of columns comprising a plurality of pairs of the plurality of contact tails;
each of the plurality of columns comprises:

at least one portion in which the pairs of contact tails have a conductor-to-conductor spacing in the first direction of a first distance;

a gap, free of contact tails, at a location between the edge of the mounting face and the second end, the gap spanning a distance in the first direction greater than the first distance; and the gap is in excess of 4 mm and the conductor-to-conductor spacing between adjacent pairs of contact tails is less than 2.0 mm.

13. The electrical connector of claim 12, wherein:

the connector comprises a plurality of ground conductors comprising mating contact portions, contact tails and intermediate portions joining the contact tails to the mating contact portions;

the mating contact portions of the plurality of ground conductors are disposed at the mating face of the connector; and the contact tails of the ground conductors are disposed within the columns such that contact tails of the ground conductors and pairs of signal conductors are in a repeating pattern along the column.

14. The electrical connector of claim 12, wherein the contact tails are press fit contact tails.

15. The electrical connector of claim 12, wherein the press fits have a working range of less than or equal to 0.36 mm.

16. The electrical connector of claim 12, wherein the intermediate portions corresponding to each pair of contact tails are edge coupled.

17. The electrical connector of claim 12, wherein the gap is between the edge of the mounting face and the first end.

18. The electrical connector of claim 12, wherein the gap divides each column into two portions.

19. The electrical connector of claim 12, wherein the pairs of contact tails are arranged in rows and each row comprises 8 pairs.

20. The electrical connector of claim 12 in combination with a printed circuit board, the circuit board comprising a routing channel aligned with the gap, wherein the gap is between the edge of the mounting face and the first end.

21. The electrical connector of claim 12 in combination with a printed circuit board, the circuit board comprising a routing channel aligned with the gap, wherein the gap divides each column into two portions.

22. An electrical connector, comprising:

a housing comprising a mating face configured to mate with a mating connector and a mounting face configured to face a printed circuit board when the connector is mounted to the printed circuit board;

a plurality of signal conductors held in the housing, the plurality of signal conductors comprising mating contact portions, contact tails and intermediate portions joining the contact tails to the mating contact portions, wherein the mating contact portions are disposed at the mating face of the connector;

wherein:

the housing has a portion comprising the mating face on one side and a surface, opposite the mating face, that is perpendicular to and joined to the mounting face at an edge;

the plurality of contact tails are disposed in a plurality of columns extending in a first direction perpendicular to the edge from a first end adjacent the edge to a second end, each of the plurality of columns comprising a plurality of pairs of the plurality of contact tails;

each of the plurality of columns comprises:

at least one portion in which the pairs of contact tails have a conductor-to-conductor spacing in the first direction of a first distance;

a gap, free of contact tails, at a location between the edge and the second end, the gap spanning a distance in the first direction greater than the first distance; and the gap is between the mating face of the housing and the first end of the column.

* * * * *

UNITED STATES PATENT AND TRADEMARK OFFICE
CERTIFICATE OF CORRECTION

Page 1 of 1

PATENT NO.          : 10,958,001 B2
APPLICATION NO.     : 16/563502
DATED               : March 23, 2021
INVENTOR(S)         : Steven E. Minich It is certified that error appears in the above-identified patent and that said Letters Patent is hereby corrected as shown below:

In the Claims

At Column 29, Claim 4, Line 36:
"the second gap spans spanning a distance in the first"
Should read:
"the second gap spans a distance in the first"

At Column 30, Claim 11, Line 40:
"the footprint is a first footprint foot print"
Should read:
"the footprint is a first footprint"

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*